US012218151B2

(12) United States Patent
Koo et al.

(10) Patent No.: US 12,218,151 B2
(45) Date of Patent: Feb. 4, 2025

(54) DISPLAY DEVICE AND MANUFACTURING METHOD THEREOF

(71) Applicant: SAMSUNG DISPLAY CO., LTD., Yongin-si (KR)

(72) Inventors: So Young Koo, Yongin-si (KR); Jay Bum Kim, Yongin-si (KR); Kyung Jin Jeon, Incheon (KR); Eok Su Kim, Seoul (KR); Jun Hyung Lim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/480,494

(22) Filed: Oct. 3, 2023

(65) Prior Publication Data

US 2024/0030235 A1 Jan. 25, 2024

Related U.S. Application Data

(62) Division of application No. 17/085,976, filed on Oct. 30, 2020, now abandoned.

(30) Foreign Application Priority Data

Jan. 22, 2020 (KR) ........................ 10-2020-0008722

(51) Int. Cl.
*H01L 33/62* (2010.01)
*H01L 27/12* (2006.01)

(52) U.S. Cl.
CPC ........ *H01L 27/124* (2013.01); *H01L 27/1288* (2013.01); *H01L 33/62* (2013.01); *H01L 2933/0066* (2013.01)

(58) Field of Classification Search
CPC ... H01L 27/124; H01L 27/1288; H01L 33/62; H01L 2933/0066
See application file for complete search history.

(56) References Cited

U.S. PATENT DOCUMENTS

| 2006/0006540 A1 | 1/2006 | Park et al. |
| 2008/0169470 A1 | 7/2008 | Lim et al. |
| 2014/0253850 A1 | 9/2014 | Lee et al. |

(Continued)

FOREIGN PATENT DOCUMENTS

| KR | 10-2017-0023271 A | 3/2017 |
| KR | 10-2018-0034856 A | 4/2018 |

(Continued)

*Primary Examiner* — Trang Q Tran
(74) *Attorney, Agent, or Firm* — Lewis Roca Rothgerber Christie LLP

(57) ABSTRACT

A display device according to an embodiment of the present disclosure includes: a substrate; a first conductive layer on the substrate; a first insulating layer on the first conductive layer; an active pattern on the first insulating layer and including a semiconductor material; a second insulating layer on the active pattern; and a second conductive layer on the second insulating layer, wherein the first insulating layer has a first opening exposing the first conductive layer, the second insulating layer has a second opening exposing the first conductive layer, a breadth of the first opening is different than a breadth of the second opening, and a side surface of the first opening and a side surface of the second opening are formed to a top surface of the first conductive layer.

4 Claims, 32 Drawing Sheets

(56) References Cited

U.S. PATENT DOCUMENTS

2018/0061856 A1    3/2018  Jiang et al.
2018/0366532 A1   12/2018  Park et al.
2019/0172851 A1*   6/2019  Yamayoshi ......... H01L 27/1248

FOREIGN PATENT DOCUMENTS

KR    10-2018-0036818 A    4/2018
KR    10-2019-0048390 A    5/2019

* cited by examiner

DISPLAY DEVICE AND MANUFACTURING METHOD THEREOF

CROSS-REFERENCE TO RELATED APPLICATIONS

This application is a continuation of U.S. patent application Ser. No. 17/085,976, filed Oct. 30, 2020, which claims priority to and the benefit of Korean Patent Application No. 10-2020-0008722, filed Jan. 22, 2020, the entire content of both of which is incorporated herein by reference.

BACKGROUND

1. Field

The present disclosure relates to a display device and a manufacturing method thereof.

2. Description of the Related Art

A display device such as a liquid crystal display (LCD), an organic light emitting diode (OLED) display, etc. includes a display panel including a plurality of pixels that can display an image. Each pixel includes a pixel electrode for receiving a data signal, and the pixel electrode is connected to at least one transistor to receive the data signal.

In order to manufacture the display device, various suitable electrical devices and conductors, such as transistors, may be formed by stacking layers of various suitable materials on a substrate and patterning the layers by methods such as a photolithography process including exposure (e.g., light exposure) utilizing a photomask.

The above information disclosed in this Background section is only for enhancement of understanding of the background of the present disclosure, and therefore it may contain information that does not form the prior art that was already generally available to a person of ordinary skill in the art.

SUMMARY

As the number of photomasks utilized in the manufacturing process of the display device increases, a manufacturing time and manufacturing cost of the display device may increase.

Aspects of embodiments of the present disclosure are directed toward reducing the number of photomasks utilized in the manufacturing process of the display device, thereby reducing the manufacturing time and manufacturing cost of the display device, and also reducing damage of the semiconductor layer in the manufacturing process.

In addition, aspects of embodiments of the present disclosure are directed toward a display device that reduces the area of one pixel, and has high resolution by reducing the number of openings for contact between different layers stacked on the substrate of the display device.

A display device according to an embodiment of the present disclosure includes: a substrate; a first conductive layer on the substrate; a first insulating layer on the first conductive layer; an active pattern on the first insulating layer and including a semiconductor material; a second insulating layer on the active pattern; and a second conductive layer on the second insulating layer, wherein the first insulating layer has a first opening exposing the first conductive layer, the second insulating layer has a second opening exposing the first conductive layer, the first opening is different in breadth from the second opening, and a side surface of the first opening and a side surface of the second opening are formed to a top surface of the first conductive layer.

The second conductive layer may include a first electrode, and the first electrode may be electrically connected to the first conductive layer through the second opening.

The second insulating layer may have a third opening exposing the active pattern, and the first electrode may be electrically connected to the active pattern though the third opening.

A third insulating layer on the active pattern, and a third conductive layer on the third insulating layer may be further included in the display device, and no other conductive layer may be between the second conductive layer and the third conductive layer in a sectional view.

A side surface of the third insulating layer may be aligned with a side surface of the third conductive layer.

The first conductive layer may include a conductive pattern overlapping the active pattern, the second conductive layer may include a pixel electrode electrically connected to the conductive pattern through the second opening, and an emission layer and a common electrode on the pixel electrode may be further included in the display device.

The first conductive layer may include a data line, and the second conductive layer may include a connecting member electrically connected to the data line through the second opening.

A side surface of the active pattern may be aligned with a side surface of the first opening.

A display device according to an embodiment of the present disclosure includes: a substrate; a first conductive layer on the substrate; a first insulating layer on the first conductive layer; an active pattern on the first insulating layer and including a semiconductor material; a second insulating layer on the active pattern; and a second conductive layer on the second insulating layer, wherein the first insulating layer has a first opening exposing the first conductive layer, the second insulating layer has a second opening exposing the first conductive layer, the first opening is different in breadth from the second opening, the first opening and the second opening are connected to each other to form one opening, and the one opening is filled with a material of the second conductive layer.

The second conductive layer may include a first electrode, and the first electrode may be electrically connected to the first conductive layer through the one opening.

The second insulating layer may have a third opening on the active pattern, and the first electrode may be electrically connected to the active pattern through the third opening.

A third insulating layer on the active pattern, and a third conductive layer on the third insulating layer may be further included in the display device, and no other conductive layer may be between the second conductive layer and the third conductive layer in a sectional view.

A side surface of the third insulating layer may be aligned with a side surface of the third conductive layer.

The first conductive layer may include a conductive pattern overlapping the active pattern, the second conductive layer may include a pixel electrode electrically connected to the conductive pattern through the one opening, and an emission layer and a common electrode on the pixel electrode may be further included in the display device.

The first conductive layer may include a data line, and the second conductive layer may include a connecting member electrically connected to the data line through the one opening.

A side surface of the active pattern may be aligned with a side surface of the first opening.

A manufacturing method of a display device according to an embodiment of the present disclosure includes: forming a first conductive layer on a substrate; forming a first insulating layer and a semiconductor layer on the first conductive layer; forming a first mask pattern including a first portion and a second portion having different thicknesses, and having a first opening, on the semiconductor layer; patterning the first insulating layer and the semiconductor layer by utilizing the first mask pattern as a mask to form a second opening of the first insulating layer; removing the second portion of the first mask pattern to form a second mask pattern including a part of the first portion and having a thickness less than the thickness of the first portion; patterning the semiconductor layer by utilizing the second mask pattern as a mask to form a semiconductor pattern; forming a second insulating layer and a second conductive layer on the semiconductor pattern; forming a third insulating layer on the second conductive layer; and forming a third mask pattern on the third insulating layer and patterning the third insulating layer by utilizing the third mask pattern as a mask to form a third opening overlapping the second opening.

The first opening may different in breadth from the second opening, and in the forming of the third opening, a side surface of the first opening and a side surface of the second opening may be formed to a top surface of the first conductive layer.

The manufacturing method may further include forming a third conductive layer on the third insulating layer, wherein the second opening may be different in breath from the third opening, in the forming of the third opening, the second opening and the third opening may be connected to each other to form one opening, and the one opening may be filled with a material of the third conductive layer.

In the forming of the semiconductor pattern by patterning the semiconductor layer, a side surface of the semiconductor pattern may be aligned with a side surface of the second opening of the first insulating layer.

According to an embodiment of the present disclosure, the number of photomasks utilized in the manufacturing process of the display device may be reduced to reduce the manufacturing time and manufacturing cost of the display device, and also, damage to the semiconductor layer may be reduced in the manufacturing process.

The display device having a reduced area of one pixel and having high resolution may be provided by reducing the number of openings for the contact between different layers stacked on the substrate of the display device.

BRIEF DESCRIPTION OF THE DRAWINGS

The accompanying drawings, together with the specification, illustrate example embodiments of the present invention. These drawings, together with the description, serve to better explain aspects and principles of the present invention.

DETAILED DESCRIPTION

Figure 1:
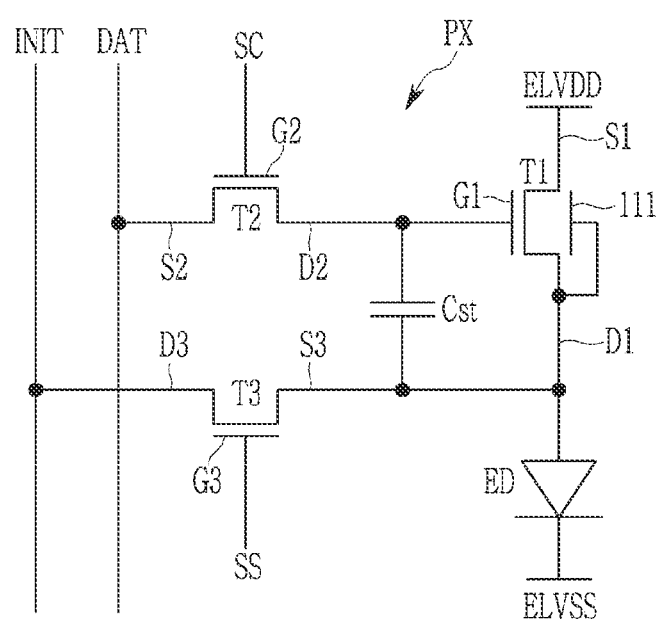
FIG. 1 is a circuit diagram of one pixel of a display device according to an embodiment of the present disclosure.

The present disclosure will be described more fully hereinafter with reference to the accompanying drawings, in which embodiments of the present disclosure are shown. As those skilled in the art would realize, the described embodiments may be modified in various and suitable different ways, all without departing from the spirit or scope of the present disclosure. As used herein, the use of the term "may," when describing embodiments of the present disclosure, refers to "one or more embodiments of the present disclosure."

In order to clearly explain the present disclosure, a portion that is not directly related to the present disclosure may be omitted, and the same reference numerals refer to the same or similar constituent elements through the entire specification.

In addition, the size and thickness of each configuration shown in the drawings may be exaggerated for better understanding and ease of description, but the present disclosure is not limited thereto. In the drawings, the thickness of layers, films, panels, regions, etc., may be exaggerated for clarity. In the drawings, for better understanding and ease of description, the thicknesses of some layers and areas may be exaggerated. As used herein, the term "substantially," "about," "approximately," and similar terms are used as terms of approximation and not as terms of degree, and are intended to account for the inherent deviations in measured or calculated values that would be recognized by those of ordinary skill in the art.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" may mean, for example, positioned on or below an element, and does not necessarily mean positioned on the upper side of the element based on a gravitational direction. As used herein, the singular forms "a", "an" and "the" are intended to include the plural forms as well, unless the context clearly indicates otherwise.

In addition, unless explicitly described to the contrary, the word "comprise" and variations such as "comprises" and "comprising" will be understood to imply the inclusion of stated elements but not the exclusion of any other elements.

Throughout this specification, a plan view means a view when observing a surface parallel to two directions (e.g., a first direction DR1 and a second direction DR2) crossing each other. For example, the surface may be parallel to a plane defined by the two directions. A cross-sectional view means a view when observing a surface cut in a direction (e.g., a third direction DR3) perpendicular to the surface parallel to the first direction DR1 and the second direction DR2. Also, for two constituent elements to overlap means that the two constituent elements overlap in the third direction DR3 (e.g., a direction perpendicular to an upper surface of the substrate) unless stated otherwise.

Now, an example of a structure of a display device according to an embodiment of the present disclosure is described with reference to FIG. 1.

FIG. 1 is a circuit diagram of one pixel PX of a display device according to an embodiment of the present disclosure.

A display device according to an embodiment of the present disclosure includes a plurality of pixels PX as a unit capable of displaying an image, and one pixel PX, as shown in FIG. 1, may include a pixel circuit unit including a plurality of transistors T1, T2, and T3 and a capacitor Cst, and at least one light emitting diode (LED) ED as a light-emitting element connected to the pixel circuit unit. In the present embodiment, an example in which one pixel PX includes one light emitting diode (LED) ED is mainly described.

The plurality of transistors T1, T2, and T3 include a first transistor T1, a second transistor T2, and a third transistor T3.

A gate electrode G1 of the first transistor T1 is connected to one terminal of the capacitor Cst, a source electrode S1 of the first transistor T1 is connected to a driving voltage line that may transmit a driving voltage ELVDD, and a drain electrode D1 of the first transistor T1 is connected to the anode of the light emitting diode (LED) ED and to the other terminal of the capacitor Cst. The first transistor T1 may receive a data voltage DAT depending on a switching operation of the second transistor T2 to supply a driving current to the light emitting diode (LED) ED depending on the voltage stored to the capacitor Cst.

The gate electrode G1 of the first transistor T1 may face a conductive pattern 111, and the conductive pattern 111 may be electrically connected to the drain electrode D1 of the first transistor T1 and to the anode of the light emitting diode (LED) ED.

A gate electrode G2 of the second transistor T2 is connected to a first scan line that may transmit a first scan signal SC, a source electrode S2 of the second transistor T2 is connected to a data line that may transmit the data voltage DAT or a reference voltage, and a drain electrode D2 of the second transistor T2 is connected to the one terminal of the capacitor Cst and the gate electrode G1 of the first transistor T1. The second transistor T2 may be turned on depending on the first scan signal SC to transmit the reference voltage or the data voltage DAT to the gate electrode G1 of the first transistor T1 and to the one terminal of the capacitor Cst.

A gate electrode G3 of the third transistor T3 is connected to a second scan line that may transmit a second scan signal SS; a source electrode S3 of the third transistor T3 is connected to the other terminal of the capacitor Cst, the drain electrode D1 of the first transistor T1, and the anode of the light emitting diode (LED) ED; and a drain electrode D3 of the third transistor T3 is connected to an initialization voltage line that may transmit an initialization voltage INIT. The third transistor T3 may be turned on depending on the second scan signal SS to transmit the initialization voltage INIT to the anode of the light emitting diode (LED) ED and to the other terminal of the capacitor Cst, thereby initializing the voltage of the anode of the light emitting diode (LED) ED.

The one terminal of the capacitor Cst is connected to the gate electrode G1 of the first transistor T1, and the other terminal is connected to the source electrode S3 of the third transistor T3 and to the anode of the light emitting diode (LED) ED. The cathode of the light emitting diode (LED) ED is connected to a common voltage line that may transmit a common voltage ELVSS.

The light emitting diode (LED) ED may emit light depending on the driving current formed by (e.g., flowing from or through) the first transistor T1.

The structure of the pixel PX included in the display device according to the example embodiment of the present disclosure is not limited to the circuit diagram shown in FIG. 1, but may have various suitable pixel structures according to the type or kind of display device.

The structure of the display device according to an embodiment of the present disclosure will now described with reference to FIG. 2 to FIG. 4 along with FIG. 1 described above.

Figure 2:
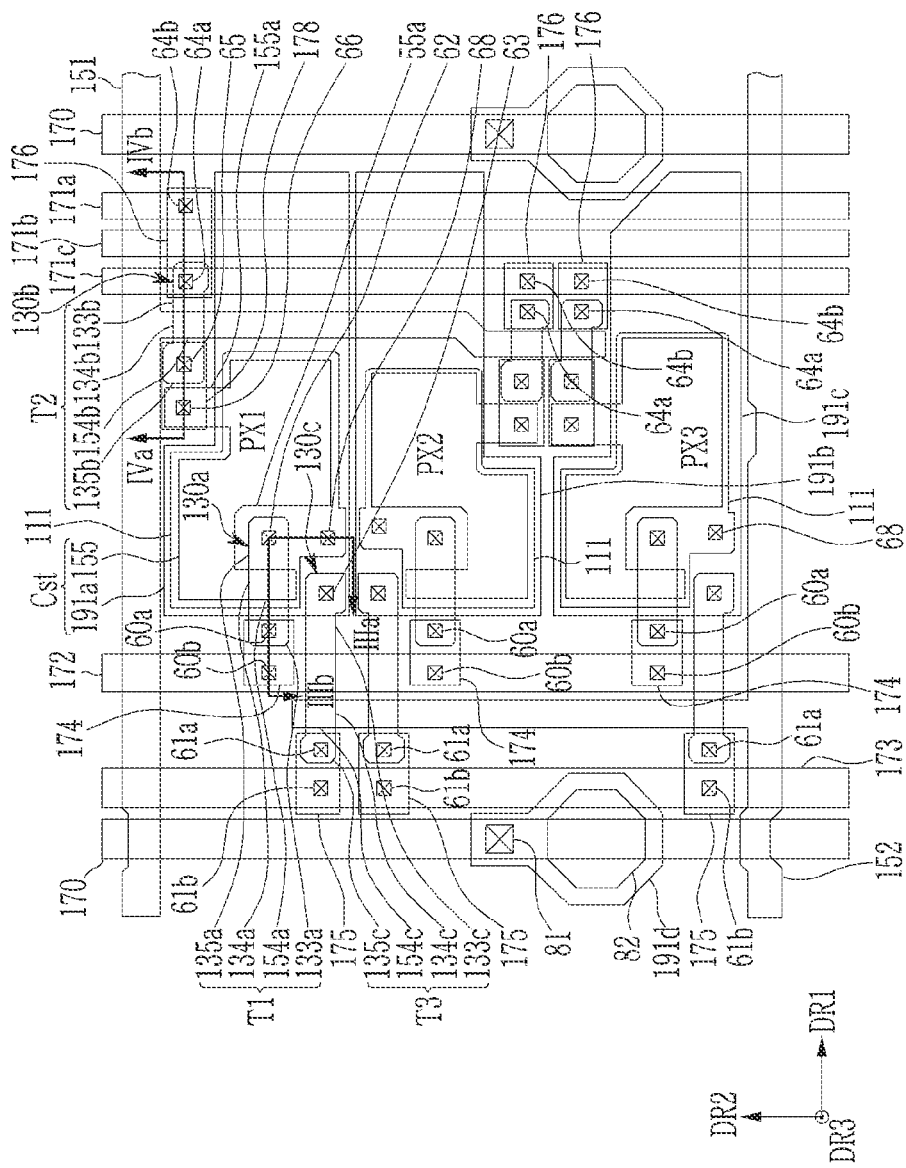
FIG. 2 is a layout view of a plurality of pixels of a display device according to an embodiment of the present disclosure.
Figure 3:
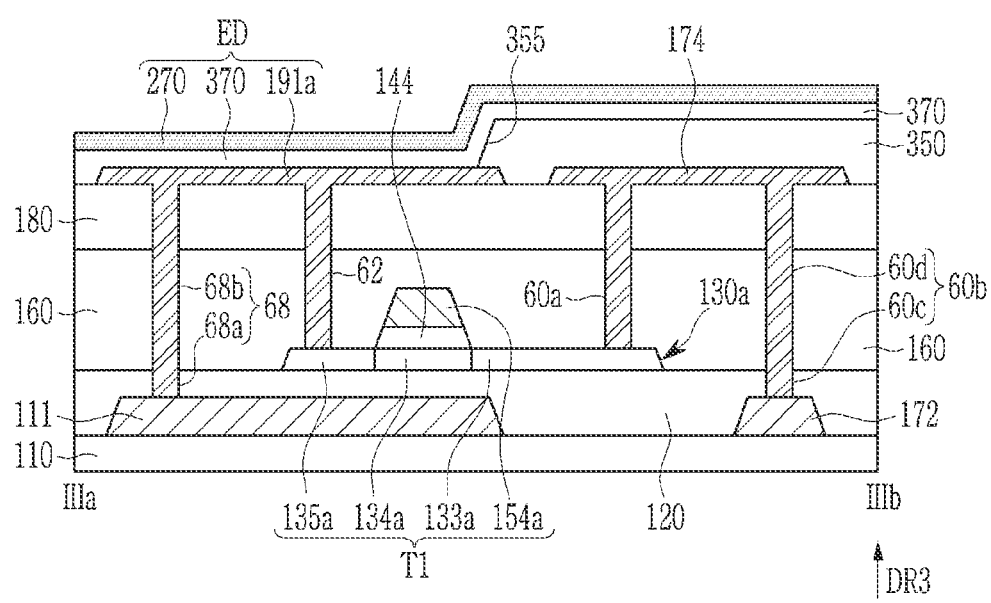
FIG. 3 is a cross-sectional view of the display device shown in FIG. 2 taken along a line IIIa-IIIb.
Figure 4:
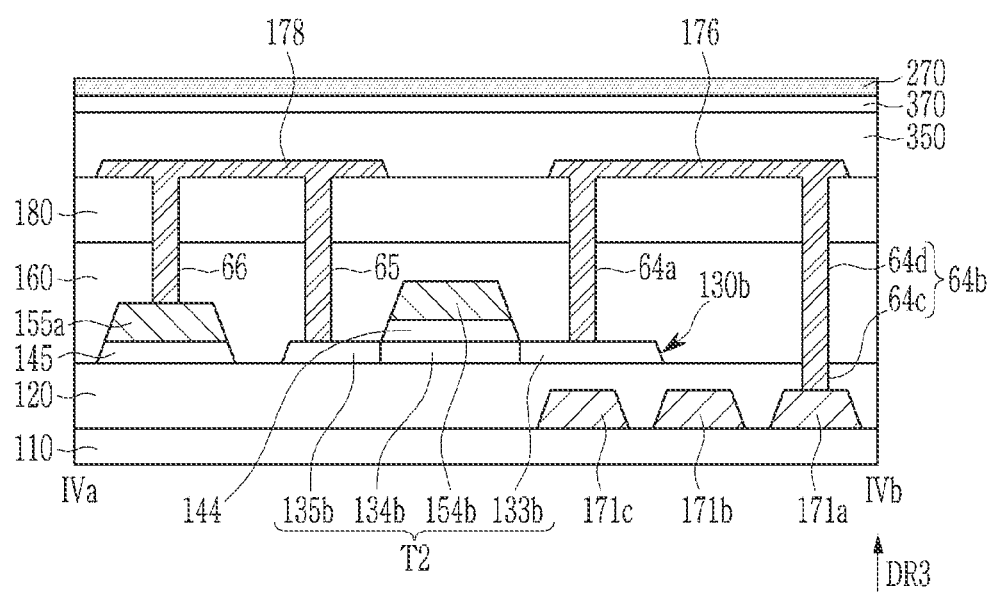
FIG. 4 is a cross-sectional view of the display device shown in FIG. 2 taken along a line IVa-IVb.

FIG. 2 is a layout view of a plurality of pixels of a display device according to an embodiment of the present disclosure, FIG. 3 is a cross-sectional view of a display device shown in FIG. 2 taken along a line IIIa-IIIb, and FIG. 4 is a cross-sectional view of a display device shown in FIG. 2 taken along a line IVa-IVb.

The display device according to an embodiment of the present disclosure may include a substrate 110. The substrate 110 may include (e.g., be) an insulating material such as glass, plastic, and the like, and may have flexibility.

A first conductive layer including the conductive pattern 111 and a plurality of signal lines and voltage lines may be disposed on the substrate 110. The plurality of signal lines and voltage lines may include a common voltage line 170, a plurality of data lines 171a, 171b, 171c, a driving voltage line 172, an initialization voltage line 173, and the like.

The conductive pattern 111 may be disposed in each pixel (PX1, PX2, PX3). The conductive pattern 111 may include (e.g., be) various suitable conductive metals, and/or semiconductor materials having suitable conductive properties, for example, conductive properties equivalent to those of a conductive metal.

In a plan view, the common voltage line 170, the plurality of data lines 171a, 171b, 171c, the driving voltage line 172, and the initialization voltage line 173 may respectively extend substantially in the second direction DR2.

A buffer layer 120, which is an insulating layer, may be disposed on the first conductive layer.

The buffer layer 120 may include an opening 68a disposed on (e.g., exposing) the conductive pattern 111, an opening disposed on (e.g, exposing) the common voltage line 170, an opening 64c disposed on (e.g., exposing) each of the data lines 171a, 171b, 171c, an opening 60c disposed on (e.g., exposing) the driving voltage line 172, and an opening disposed on the initialization voltage line 173.

An active layer including a plurality of active patterns 130a, 130b, and 130c may be disposed on the buffer layer 120. The active pattern (130a, 130b, and 130c) disposed in each pixel (PX1, PX2, PX3) may include a channel region (134a, 134b, and 134c) forming each channel of the plurality of transistors T1, T2, and T3 described above, and a conductive region connected thereto. The conductive region of each active pattern (130a, 130b, and 130c) may include a source region (133a, 133b, and 133c) and a drain region (135a, 135b, and 135c) of each transistor (T1, T2, and T3).

The plurality of active patterns 130a, 130b, and 130c disposed in each of the pixels PX1, PX2 and PX3 are separated from each other, but are not limited thereto.

The active layer may include (e.g., be) a semiconductor material such as an amorphous silicon, polysilicon, or an oxide semiconductor, for example, indium gallium zinc oxide (IGZO).

Insulating patterns 144 and 145 of a first insulating layer may be disposed on the active layer. The insulating pattern 144 may be disposed on the channel region (134a, 134b, and 134c) while overlapping the channel region (134a, 134b, and 134c) of the active pattern (130a, 130b, and 130c). The insulating pattern 144 may not substantially overlap the conductive region of the active patterns 130a, 130b, and 130c. The insulating pattern 145 may not overlap the active layer.

A second conductive layer may be disposed on the insulating patterns 144 and 145.

The second conductive layer may include a first scan line 151 capable of transmitting (e.g., that may transmit) the above-described first scan signal SC, a second scan line 152 capable of transmitting (e.g., that may transmit) a second scan signal SS, a driving gate electrode 155, a first gate electrode 154a, a second gate electrode 154b, a third gate electrode 154c, and the like. The gate electrode G1, the gate electrode G2, and the gate electrode G3 in FIG. 1 described above may respectively correspond to the first gate electrode 154a, the second gate electrode 154b, and the third gate electrode 154c included in the second conductive layer. The driving gate electrode 155 may be referred to as a first gate electrode.

Each of the first and second scan lines 151 and 152 may extend substantially in the first direction DR1, thereby crossing the common voltage line 170, the data lines 171a, 171b, 171c, the driving voltage line 172, and the initialization voltage line 173.

The driving gate electrode 155 may be disposed corresponding to each pixel PX1, PX2, PX3. The driving gate electrode 155 disposed in each of the pixels PX1, PX2, PX3 may include the first gate electrode 154a of a shape protruded upwardly or downwardly, and a protruded part 155a protruded downwardly or upwardly. For example, the first gate electrode 154a may protrude in a direction opposite to the second direction DR2, and the protruded part 155a may protrude in the second direction DR2. The first gate electrode 154a overlaps the channel region 134a of the active pattern 130a and crosses the active pattern 130a.

The plurality of second gate electrodes 154b corresponding to the plurality of pixels PX1, PX2, PX3 may be connected to each other to form a long shape extending in the second direction DR2, and may be electrically connected to the first scan line 151. The second gate electrode 154b overlaps the channel region 134b of the active pattern 130b while crossing the active pattern 130b of each of the pixels PX1, PX2, PX3.

The plurality of third gate electrodes 154c corresponding to the plurality of pixels PX1, PX2, PX3 may be connected to each other to form a long shape extending in the second direction DR2, and may be electrically connected to the second scan line 152. The third gate electrode 154c overlaps the channel region 134c of the active pattern 130c while crossing the active pattern 130c of each of the pixels PX1, PX2, PX3.

The edge (e.g., side surface, such as a side surface that extends in the second direction DR2 and that has a normal direction parallel to the first direction DR1) of the first gate electrode 154a, the edge of the second gate electrode 154b, and the edge of the third gate electrode 154c respectively overlapping the active patterns 130a, 130b, and 130c may be aligned parallel (e.g., substantially parallel) to the respective edge (e.g., side surface) of the underlying insulating pattern 144 and aligned to the respective one of the channel regions 134a, 134b, and 134c.

At least one selected from among the first conductive layer and the second conductive layer may include (e.g., be) at least one selected from among metals such as copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), alloys thereof, and the like. At least one selected from among the first conductive layer and the second conductive layer may include a single layer or multiple layers. For example, the second conductive layer may have a multilayer structure including a lower layer including (e.g., being) titanium and an upper layer including (e.g., being) copper.

A second insulating layer 160 may be disposed on the second conductive layer.

A third insulating layer 180 may be disposed on the second insulating layer 160.

The second insulating layer 160 and the third insulating layer 180 may include a plurality of openings 60a, 60d, 61a, 61b, 62, 63, 64a, 64d, 65, 66, 68b, and 81.

The opening 68b may overlap the opening 68a of the buffer layer 120. The opening 68b may be connected to the opening 68a of the buffer layer 120 to form one opening 68. The planar size (e.g., breadth, diameter, or planar area) of the opening 68b may be the same as or different from the planar size (e.g., breadth, diameter, or planar area) of the opening 68a.

The opening 81 may overlap the opening of the buffer layer 120 disposed on (e.g., exposing) the common voltage line 170. The opening 81 may be connected to the opening of the buffer layer 120 disposed on the common voltage line 170 to form one opening (designated by reference numeral 81).

The opening 64d may overlap the opening 64c of the buffer layer 120. The opening 64d may be connected to the opening 64c of the buffer layer 120 to form one opening 64b. The planar size (e.g., breadth, diameter, or planar area) of the opening 64d may be the same as or different from the planar size (e.g., breadth, diameter, or planar area) of the opening 64c.

The opening 60d may overlap the opening 60c of the buffer layer 120. The opening 60d may be connected to the opening 60c of the buffer layer 120 to form one opening 60b. The planar size (e.g., breadth, diameter, or planar area) of the opening may be the same as or different from the planar size (e.g., breadth, diameter, or planar area) of the opening 60c.

The opening 61b may overlap the opening disposed on (e.g., exposing) the initialization voltage line 173. The opening 61b may be connected to (or correspond to) the opening disposed on the initialization voltage line 173 to form one opening (denoted by reference numeral 61b).

The opening 60a may be disposed on (e.g., expose) the source region 133a of the active pattern 130a. The opening 62 may be disposed on (e.g., expose) the drain region 135a of the active pattern 130a. The opening 61a may be disposed on (e.g., expose) the drain region 135c of the active pattern 130c. The opening 63 may be disposed on (e.g., expose) the source region 133c of the active pattern 130c. The opening 66 may be disposed on (e.g., expose) the protruded part 155a of the driving gate electrode 155. The opening 65 may be disposed on (e.g., expose) the drain region 135b of the active pattern 130b. The opening 64a may be disposed on (e.g., expose) the source region 133b of the active pattern 130b.

At least one selected from among the buffer layer 120, the second insulating layer 160, and the third insulating layer 180 may include (e.g., be) an inorganic insulating material such as a silicon nitride (SiNx), a silicon oxide (SiOx), and/or a silicon oxynitride (SiON), and/or an organic insulation material. For example, the third insulating layer 180 may include (e.g., be) an organic insulating material such as a polyimide, an acrylic polymer, and/or a siloxane polymer, and may have a substantially flat top surface, and the second insulating layer 160 may include (e.g., be) an inorganic insulating material.

The second insulating layer 160 may be omitted.

A third conductive layer may be disposed on the third insulating layer 180.

The third conductive layer may include a plurality of pixel electrodes 191a, 191b, and 191c and a plurality of connecting members 174, 175, 176, 178, and 191d.

Each of the plurality of pixel electrodes 191a, 191b, and 191c is electrically connected to the drain region 135a of the first transistor T1 through the opening 62 of the second insulating layer 160 and the third insulating layer 180 in each of the pixels PX1, PX2, PX3, thereby receiving the voltage from the first transistor T1. Also, each of the plurality of pixel electrodes 191a, 191b, and 191c may be electrically connected to the conductive pattern 111 through the opening 68 of the buffer layer 120, the second insulating layer 160, and the third insulating layer 180. Accordingly, the drain region 135a of the first transistor T1 may be electrically connected to the conductive pattern 111.

Each of the pixel electrodes 191a, 191b, and 191c overlaps the driving gate electrode 155 facing thereto via (e.g., each of the pixel electrodes 191a, 191b, and 191c may face the driving gate electrode 155 through) the second insulating layer 160 and the third insulating layer 180 to form the capacitor Cst. For connection between the pixel electrodes 191a, 191b, and 191c and the drain region 135a of the active pattern 130a, the driving gate electrode 155 may have an opening 55a overlapping the opening 62.

The connecting member 174 may be electrically connected to the source region 133a of the active pattern 130a through the opening 60a and may be electrically connected to the driving voltage line 172 through the opening 60b in each pixel (PX1, PX2, PX3), and resultantly, the source region 133a of the active pattern 130a and the driving voltage line 172 may be electrically connected to each other.

The connecting member 175 may be electrically connected to the drain region 135c of the active pattern 130c through the opening 61a and may be electrically connected to the initialization voltage line 173 through the opening 61b in each pixel (PX1, PX2, PX3), and resultantly, the drain region 135c of the active pattern 130c and the initialization voltage line 173 may be electrically connected to each other.

The connecting member 176 may be electrically connected to the source region 133b of the active pattern 130b through the opening 64a and may be electrically connected to each data line (171a, 171b, 171c) through the opening 64b in each pixel (PX1, PX2, PX3), and resultantly, the source region 133b of the active pattern 130b and each data line (171a, 171b, 171c) may be electrically connected to each other.

The connecting member 178 may be electrically connected to the drain region 135b of the active pattern 130b through the opening 65 and may be electrically connected to the protruded part 155a of the driving gate electrode 155 through the opening 66 in each pixel (PX1, PX2, PX3), and resultantly, the drain region 135b of the active pattern 130b and the protruded part 155a of the driving gate electrode 155 may be electrically connected to each other.

The connecting member 191d may be electrically connected to the common voltage line 170 through the opening 81.

The third conductive layer may include (e.g., be) a semipermeable conductive material and/or a reflective conductive material.

In some embodiments, any other conductive layer is not disposed between the second conductive layer and the third conductive layer in a sectional view (e.g., cross-sectional view).

The first transistor T1 includes the channel region 134a, the source region 133a, the drain region 135a, and the first gate electrode 154a. The source region 133a of the first transistor T1 is electrically connected to the driving voltage line 172, thereby receiving the driving voltage.

The conductive pattern 111 corresponding to the first transistor T1 overlaps the channel region 134a between the channel region 134a of the first transistor T1 and the substrate 110 so that external light does not reach the channel region 134a, thereby reducing a leakage current and deterioration of characteristics. The conductive pattern 111 is electrically connected to the drain region 135a of the first transistor T1 through the pixel electrodes 191a, 191b, and 191c.

The second transistor T2 includes the channel region 134b, the source region 133b, the drain region 135b, and the second gate electrode 154b. The source region 133b of the second transistor T2 is electrically connected to each of the data lines 171a, 171b, 171c, thereby receiving the data voltage or the reference voltage. The drain region 135b of the second transistor T2 may be electrically connected to the first gate electrode 154a through the driving gate electrode 155.

The third transistor T3 includes the channel region 134c, the source region 133c, the drain region 135c, and the third gate electrode 154c. The drain region 135c of the third transistor T3 may receive an initialization voltage from the initialization voltage line 173.

A fourth insulating layer 350 may be disposed on the third conductive layer. The fourth insulating layer 350 may have an opening 355 respectively disposed on each of the pixel electrodes 191a, 191b and 191c.

The fourth insulating layer 350 may include (e.g., be) an organic insulating material such as a polyacrylic resin and/or a polyimide resin.

An emission layer 370 may be disposed between the fourth insulating layer 350 and the third conductive layer. In some embodiments, the emission layer 370 may be disposed on the third conductive layer and on the fourth insulating layer 350. The emission layer 370 may include a part disposed in the opening 355 of the fourth insulating layer 350. The emission layer 370 may include (e.g., be) an organic light emitting material and/or an inorganic light emitting material. The emission layer 370 may include a portion disposed on the fourth insulating layer 350, and at least a portion of the fourth insulating layer 350 may not be covered by the emission layer 370.

The fourth insulating layer 350 and the emission layer 370 may have an opening 82 disposed on (e.g., exposing) the connecting member 191d.

A common electrode 270 is disposed on the emission layer 370. The common electrode 270 may be continuously formed over the plurality of pixels PX1, PX2, PX3. The common electrode 270 is in contact with the connecting member 191d through the opening 82 to be electrically connected to the common voltage line 170, and the common electrode 270 may thereby receive the common voltage.

The common electrode 270 may include (e.g., be) a conductive transparent material.

Each pixel electrode (191a, 191b, and 191c), the emission layer 370, and the common electrode 270 together form the light emitting diode (LED) ED, and one of the pixel electrode (191a, 191b, and 191c) and the common electrode 270 becomes (e.g., constitutes) a cathode and the other becomes (e.g., constitutes) an anode. In the above, an example in which the pixel electrodes 191a, 191b, and 191c become (e.g., constitute) the anode of the light emitting diode ED has been described.

An area in which the opening 355 of the fourth insulating layer 350 is disposed in a plan view may define a light emitting area of each pixel (PX1, PX2, PX3).

As the conductive pattern 111 is electrically connected to each corresponding pixel electrode (191a, 191b, and 191c) and overlaps the channel region 134a of the first transistor T1, a current variation rate is reduced in a saturation region of a voltage-current characteristic graph of the first transistor T1 so that a range of a region where the output current of the first transistor T1 is constant may be widened. Therefore, even if there is a change in the source-drain voltage of the first transistor T1, the output current of the first transistor T1 is kept constant, thereby improving the output saturation characteristic. Thus, the luminance deviation between the pixels due to the output current of the first transistor T1 is reduced, thereby improving the image quality.

According to the present embodiment, the number of the conductive layers and insulating layers configuring the transistors T1, T2, and T3 and the light-emitting device ED disposed on the substrate 110 may be minimized or reduced, thereby simplifying the structure of the display device.

Next, a manufacturing method of the display device according to an embodiment of the present disclosure is described with reference to FIG. 5 to FIG. 16 along with FIG. 1 to FIG. 4 described above.

Figure 5:
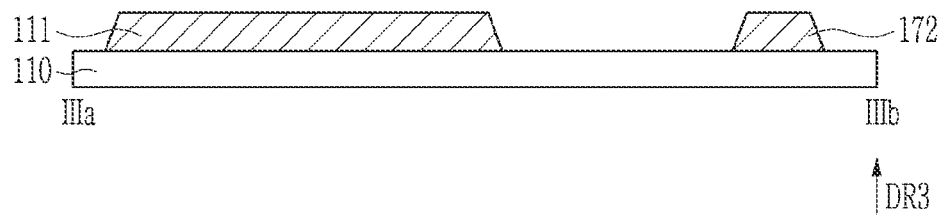
FIG. 5 and FIG. 6 are cross-sectional views of a display device in a process of a manufacturing method of a display device according to embodiments of the present disclosure and are, respectively, cross-sectional views taken along lines corresponding to lines IIIa-IIIb and IVa-IVb shown in FIG. 2, FIG. 7 and FIG. 8 are cross-sectional views of a display device in a process after a manufacturing process of a display device respectively shown in FIG. 5 and FIG. 6 and are, respectively, cross-sectional views taken along lines corresponding to lines IIIa-IIIb and IVa-IVb shown in FIG. 2, FIG. 9 and FIG. 10 are cross-sectional views of a display device in a process after a manufacturing process of a display device respectively shown in FIG. 7 and FIG. 8 and are, respectively, cross-sectional views taken along lines corresponding to lines IIIa-IIIb and IVa-IVb shown in FIG. 2, FIG. 11 and FIG. 12 are cross-sectional views of a display device in a process after a manufacturing process of a display device respectively shown in FIG. 9 and FIG. 10 and are, respectively, cross-sectional views taken along lines corresponding to lines IIIa-IIIb and IVa-IVb shown in FIG. 2, FIG. 13 and FIG. 14 are cross-sectional views of a display device in a process after a manufacturing process of a display device respectively shown in FIG. 11 and FIG. 12 and are, respectively, cross-sectional views taken along lines corresponding to lines IIIa-IIIb and IVa-IVb shown in FIG. 2, FIG. 15 and FIG. 16 are cross-sectional views of a display device in a process after a manufacturing process of display device respectively shown in FIG. 13 and FIG. 14 and are, respectively, cross-sectional views taken along lines corresponding to lines IIIa-IIIb and IVa-IVb shown in FIG. 2.
Figure 6:
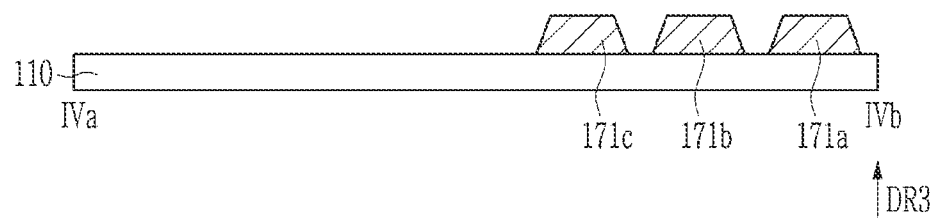

FIG. 5 and FIG. 6 are cross-sectional views of a display device in a process of a manufacturing method of a display device according to embodiments of the present disclosure and are, respectively, are cross-sectional views taken along a line corresponding to lines IIIa-IIIb and IVa-IVb shown in FIG. 2.

Referring to FIG. 5 and FIG. 6, by stacking and patterning various suitable conductive metals and/or the semiconductor materials having the suitable conductive characteristics, for example, conductive characteristics equivalent to those of a conductive metal, on the insulating substrate 110, the first conductive layer including the conductive pattern 111, the common voltage line 170, the plurality of data lines 171a, 171b, 171c, the driving voltage line 172, the initialization voltage line 173, and the like is formed. The patterning method may utilize photolithography including an exposure utilizing a photomask.

Figure 7:
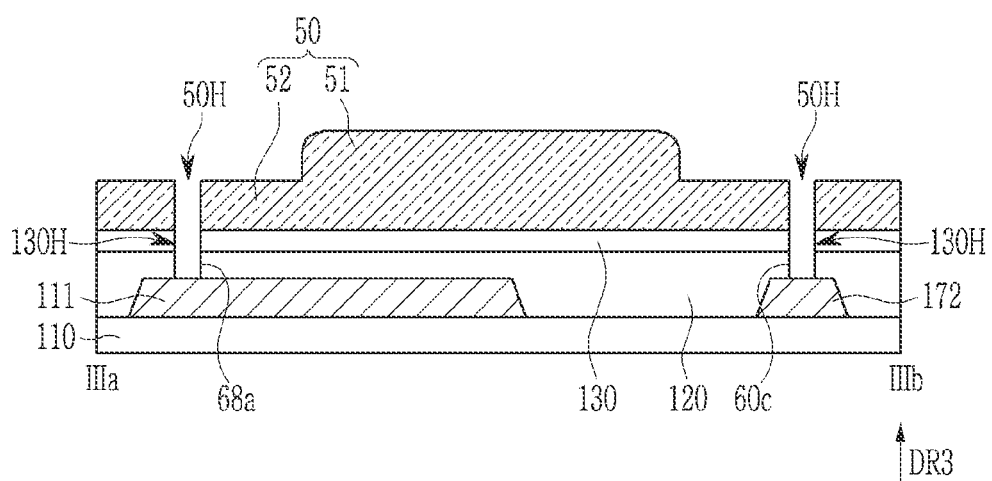
Figure 8:
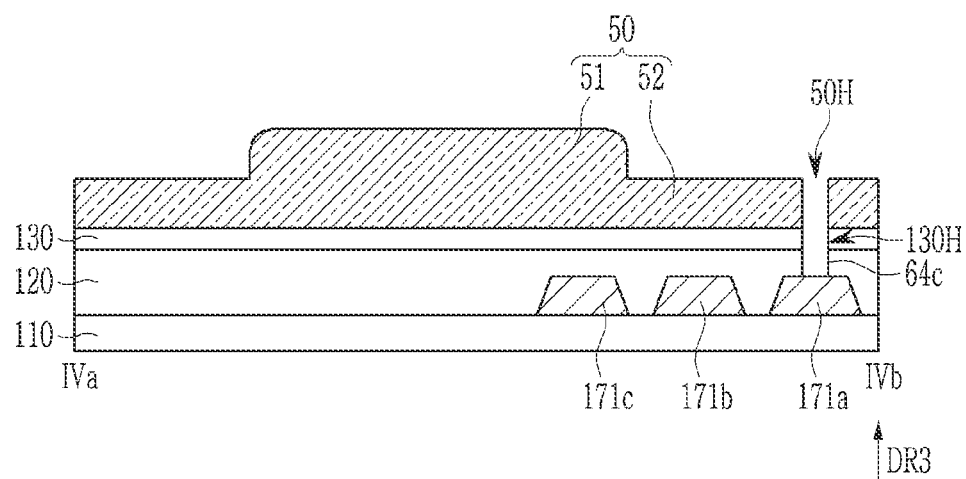

FIG. 7 and FIG. 8 are cross-sectional views of a display device in a process after (e.g., next to) a manufacturing process of a display device respectively shown in FIG. 5 and FIG. 6 and are, respectively, cross-sectional views taken along lines corresponding to lines IIIa-IIIb and IVa-IVb shown in FIG. 2.

Referring to FIG. 7 and FIG. 8, the insulating material is stacked on the substrate 110 and the first conductive layer to form the buffer layer 120, and a semiconductor material such as amorphous silicon, polysilicon, and/or an oxide semiconductor is stacked on the buffer layer 120 to form a semiconductor layer 130. Subsequently, a photosensitive material such as a photoresist is stacked on the semiconductor layer 130, and the photosensitive material layer is exposed (e.g., exposed to light) utilizing a halftone photomask to form a mask pattern 50.

The mask pattern 50 may include a first portion 51 and a second portion 52 that is thinner than the first portion 51, and may have an opening 50H from which the photosensitive material layer is removed. The first portion 51 may be formed to correspond to the active patterns 130a, 130b, and 130c described above.

Subsequently, a semiconductor layer 130 and the buffer layer 120 are etched utilizing the mask pattern 50 having the opening 50H as a mask to form the openings 60c, 64c, and 68a of the buffer layer 120 corresponding to the opening 50H and an opening 130H of the semiconductor layer 130.

Figure 9:
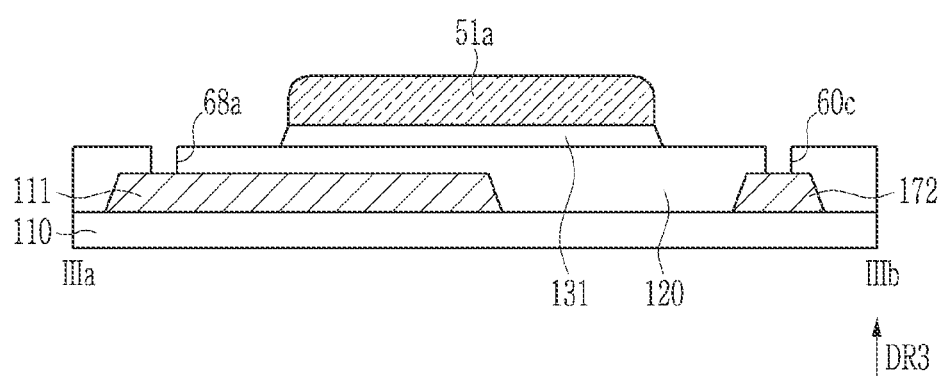
Figure 10:
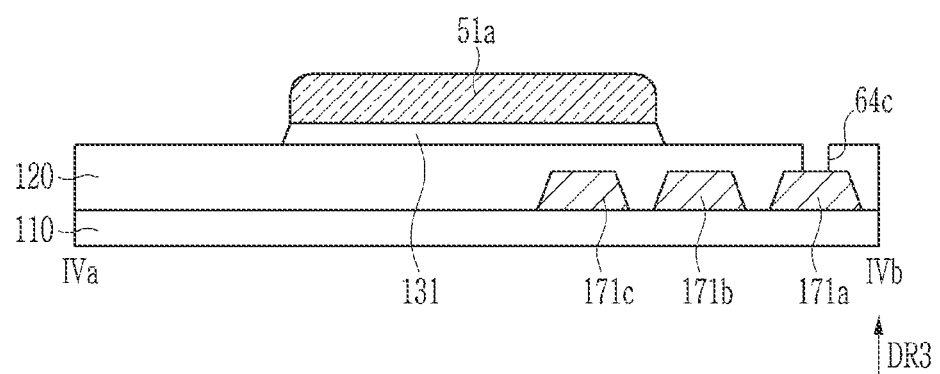

FIG. 9 and FIG. 10 are cross-sectional views of a display device in a process after (e.g., next to) a manufacturing process of a display device respectively shown in FIG. 7 and FIG. 8 and are, respectively, cross-sectional views taken along lines corresponding to lines IIIa-IIIb and IVa-IVb shown in FIG. 2.

Referring to FIG. 9 and FIG. 10, the mask pattern 50 may be etched back or ashed to remove the second portion 52 and to form a mask pattern 51a including at least a portion or part of the first portion 51.

Next, the semiconductor layer 130 is patterned utilizing the mask pattern 51a as a mask to form a plurality of semiconductor patterns 131. The patterning method may utilize wet etching. An etchant having a sufficiently large selectivity of the semiconductor layer 130 with respect to the first conductive layer of the etchant may be selected. Accordingly, in the etching process of the semiconductor layer 130, etching of and damage to the first conductive layer may hardly occur.

Figure 11:
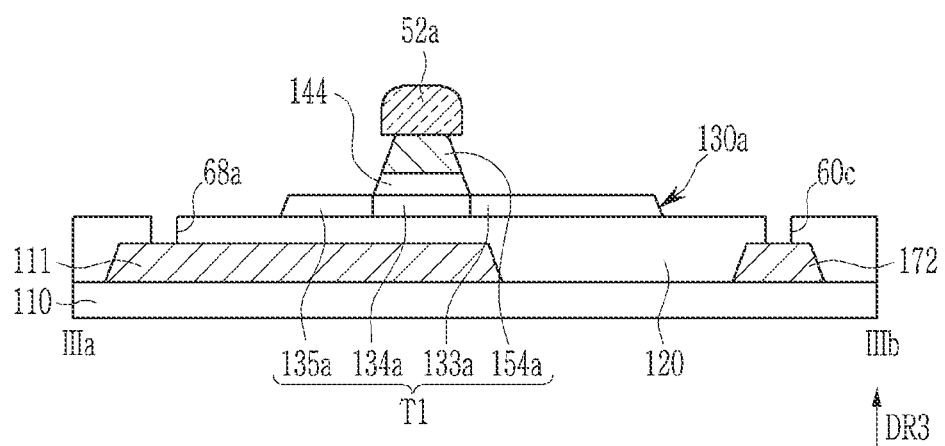
Figure 12:
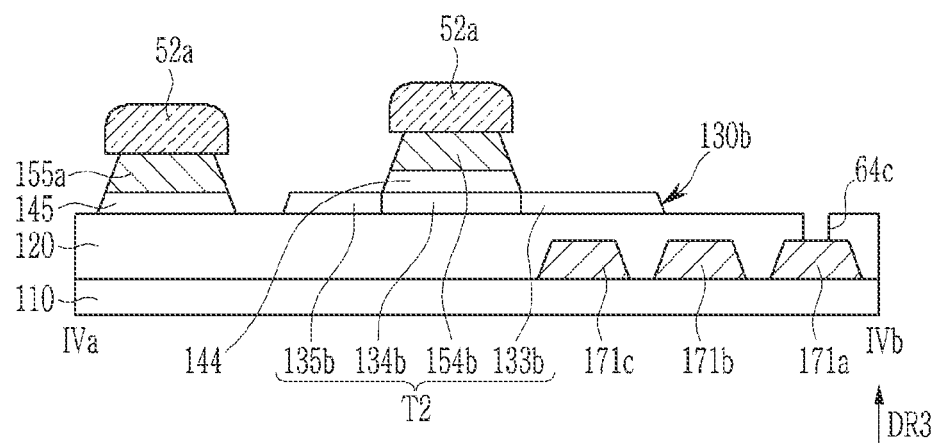

FIG. 11 and FIG. 12 are cross-sectional views of a display device in a process after (e.g., next to) a manufacturing process of a display device respectively shown in FIG. 9 and FIG. 10 and are, respectively, cross-sectional views taken along lines corresponding to lines IIIa-IIIb and IVa-IVb shown in FIG. 2.

Referring to FIG. 11 and FIG. 12 along with FIG. 9 and FIG. 10, the mask pattern 51a is removed from the semiconductor pattern 131, an insulating material is stacked on the substrate 110, a conductive material is stacked on the insulating material layer, and a mask pattern 52a such as a photoresist is formed on the conductive material layer. Next, the insulating material layer and the conductive material layer are patterned by utilizing the mask pattern 52a as a mask to form the insulating patterns 144 and 145 and the underlying second conductive layer including the first scan line 151 including the second gate electrode 154b, the second scan line 152 including the third gate electrode 154c, and the driving gate electrode 155 including the protruded part 155a and the first gate electrode 154a. The patterning of the second conductive layer may utilize wet etching, and the patterning of the insulating patterns 144 and 145 may utilize dry etching.

During the dry etching for patterning the insulating patterns 144 and 145, the semiconductor pattern 131 exposed without being covered by the insulating pattern 144 may be doped with N-type (e.g., N-based) or P-type (e.g., P-based) impurities. Accordingly, the active patterns 130a, 130b, and 130c including the channel regions 134a, 134b, and 134c overlapping the insulating pattern 144, the source regions 133a, 133b, and 133c, and the drain regions 135a, 135b, and 135c may be formed. After the dry etching of the insulating patterns 144 and 145, a process of doping N-type (e.g., N-based) or P-type (e.g., P-based) impurities into the semiconductor pattern 131 that is not covered by the insulating pattern 144 to be exposed may be further performed.

Figure 13:
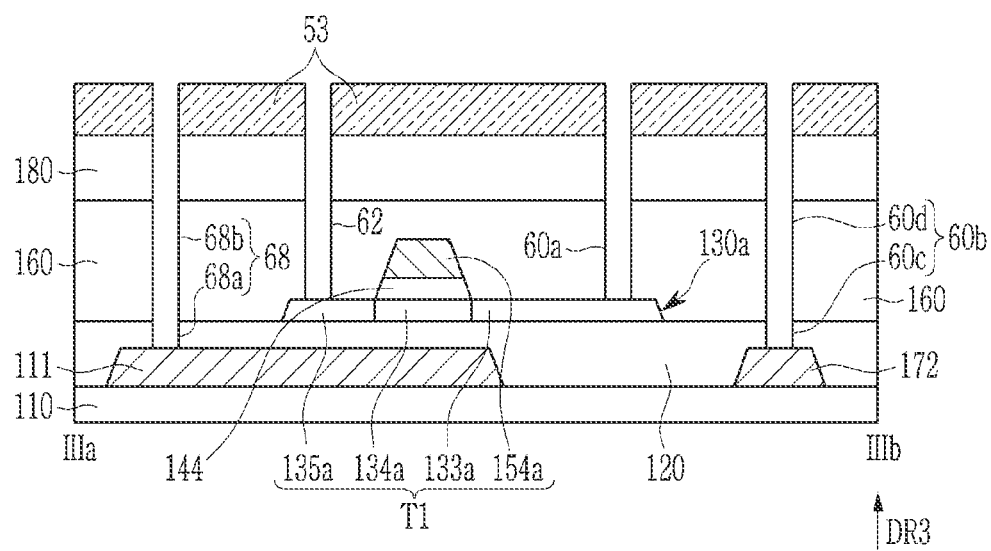
Figure 14:
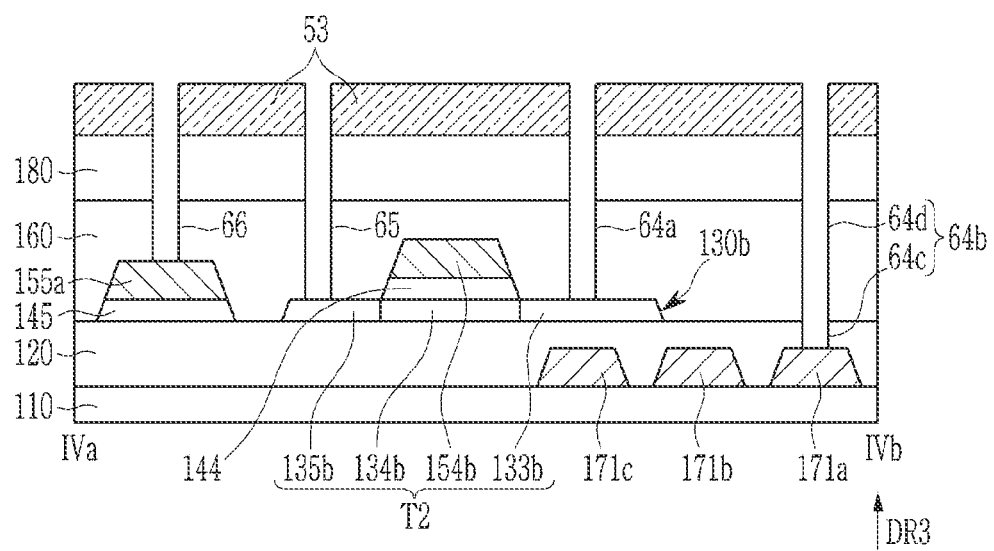

FIG. 13 and FIG. 14 are cross-sectional views of a display device in a process after (e.g., next to) a manufacturing process of a display device respectively shown in FIG. 11 and FIG. 12 and are, respectively, cross-sectional views taken along lines corresponding to lines IIIa-IIIb and IVa-IVb shown in FIG. 2.

Referring to FIG. 13 and FIG. 14, after removing the mask pattern 52a, an insulating material (e.g., an inorganic insulating material) is stacked on the substrate 110 to form the second insulating layer 160, and an insulating material (e.g., an organic insulating material) is stacked on the second insulating layer 160 to form the third insulating layer 180. Next, a mask pattern 53 such as a photoresist is formed on the third insulating layer 180. Next, the third insulating layer 180 and the second insulating layer 160 are patterned by utilizing the mask pattern 53 as a mask to form the plurality of openings 60a, 60d, 61a, 61b, 62, 63, 64a, 64d, 65, 66, 68b, and 81 as described above. Here, the patterning method may utilize dry etching. In this case, because the openings 60c, 64c, and 68a are already formed in the buffer layer 120, the buffer layer 120 does not need to be etched when the third insulating layer 180 and the second insulating layer 160 are etched. Therefore, in the process of forming the openings in the second insulating layer 160 and the third insulating layer 180, the etching of the active patterns 130a, 130b, and 130c and the corresponding damage thereto may be prevented or reduced.

Figure 15:
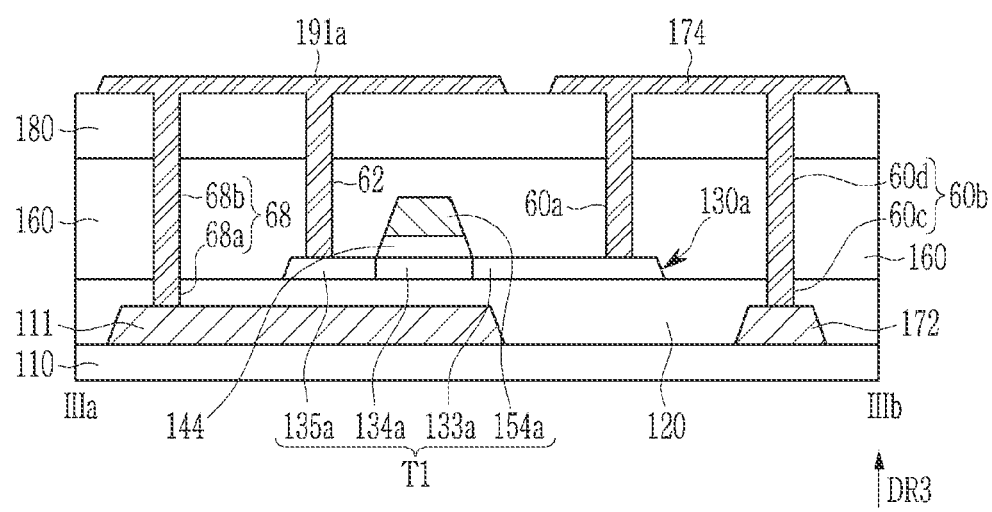
Figure 16:
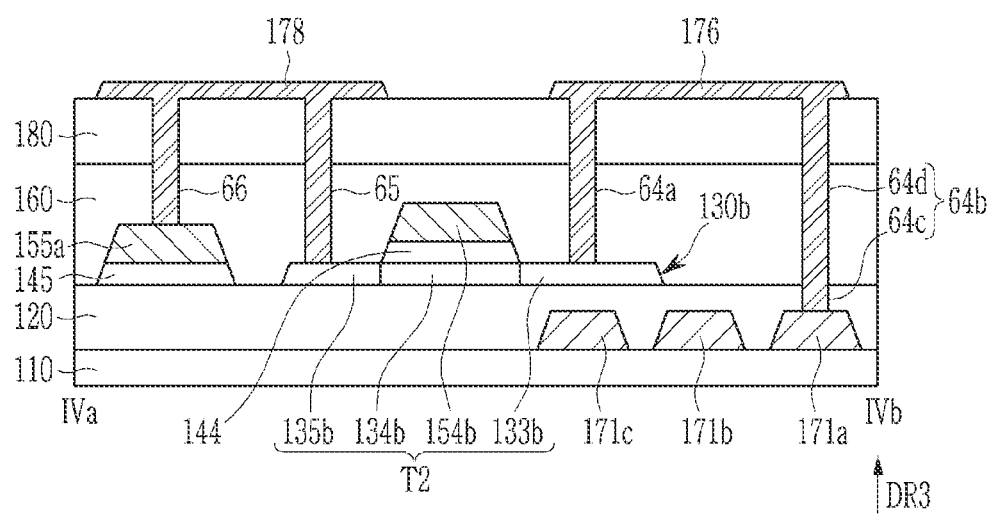

FIG. 15 and FIG. 16 are cross-sectional views of a display device in a process after (e.g., next to) a manufacturing process of a display device respectively shown in FIG. 13 and FIG. 14 and are, respectively, cross-sectional views taken along lines corresponding to lines IIIa-IIIb and IVa-IVb shown in FIG. 2.

Referring to FIG. 15 and FIG. 16, a conductive material is stacked on the third insulating layer 180 and patterned to form the third conductive layer including the plurality of pixel electrodes 191a, 191b, and 191c and the plurality of connecting members 174, 175, 176, 178, and 191d.

As shown in FIG. 3 and FIG. 4, the fourth insulating layer 350 is formed on the third conductive layer and patterned to form the opening 355, and the emission layer 370 and the common electrode 270 may be sequentially formed thereon.

According to the manufacturing method of the display device according to the present embodiment, the process for forming the transistors T1, T2, and T3 and the light emitting diode (LED) ED of the pixel PX1, PX2, PX3 needs a total of six photomasks including the photomask for patterning the first conductive layer, the halftone photomask for forming the opening of the buffer layer 120 and forming the semiconductor pattern 131, the photomask for patterning the insulating patterns 144 and 145 and the second conductive layer patterning, the photomask for forming the opening of the second insulating layer 160 and the third insulating layer 180, the photomask for patterning the third conductive layer, and the photomask for forming the opening 355 of the fourth insulating layer 350. Therefore, the manufacturing time and manufacturing cost of the display device may be reduced by reducing the number of photomasks utilized in the manufacturing process as compared with the related art.

In addition, as described above, in the process of forming the openings in the second insulating layer 160 and the third insulating layer 180, because the openings 64c, and 68a are already formed in the buffer layer 120, the buffer layer 120 does not need to be etched when etching the third insulating layer 180 and the second insulating layer 160. Therefore, in the process of forming the openings in the second insulating layer 160 and the third insulating layer 180, the etching of the active patterns 130a, 130b, and 130c and the corresponding damage thereto may be prevented or reduced.

In addition, as described above, in the process of forming the openings in the second insulating layer 160 and the third insulating layer 180, the buffer layer 120 does not need to be etched, thereby reducing the etching time. Accordingly, it is possible to prevent, or reduced the occurrence of, a problem that the surface of the third insulating layer 180 becomes uneven or rough due to over-etching.

Next, the display device according to an embodiment of the present disclosure is described with reference to FIG. 17 and FIG. 18 along with FIG. 2 to FIG. 4 described above.

Figure 17:
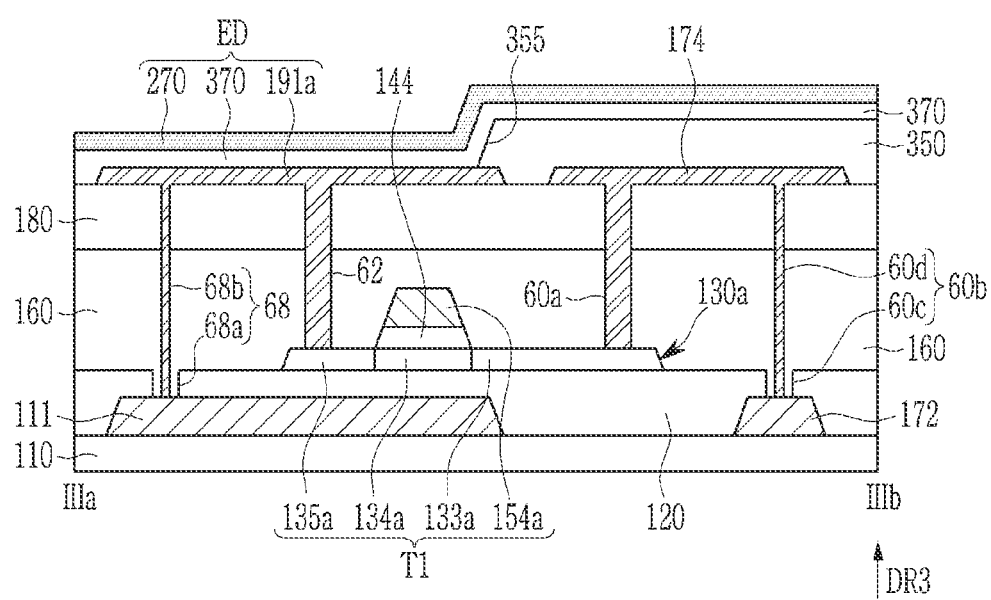
FIG. 17 is a cross-sectional view of a display device shown in FIG. 2 taken along a line IIIa-IIIb as another example embodiment.
Figure 18:
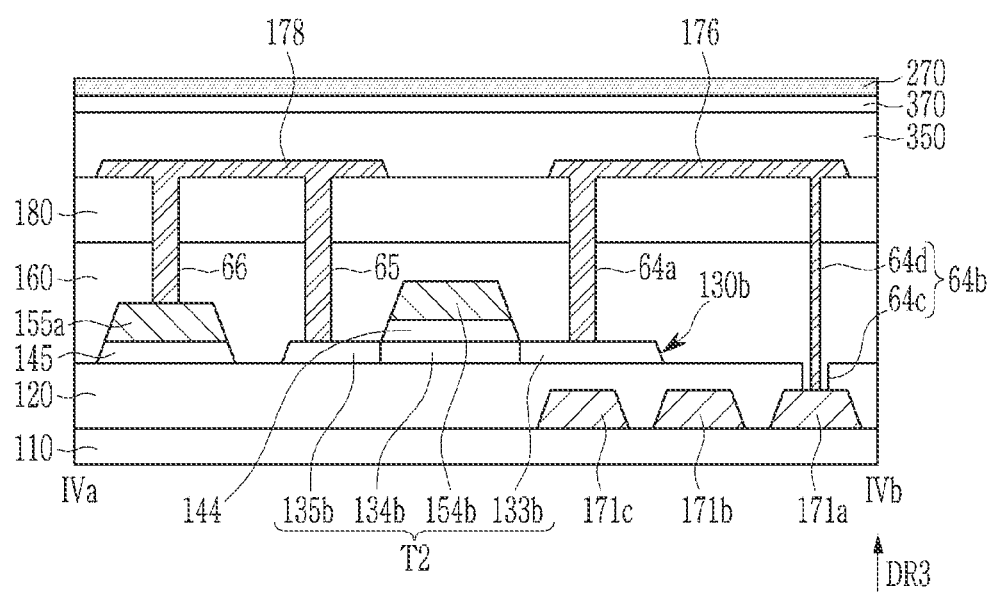
FIG. 18 is a cross-sectional view of a display device shown in FIG. 2 taken along a line IVa-IVb as another example embodiment.

FIG. 17 is a cross-sectional view of a display device shown in FIG. 2 taken along a line IIIa-IIIb as another example embodiment, and FIG. 18 is a cross-sectional view of a display device shown in FIG. 2 taken along a line IVa-IVb as another example embodiment.

Referring to FIG. 17 and FIG. 18, the display device according to the present embodiment is the same as most of the display device according to the embodiment described in FIG. 2 to FIG. 4, however the size and/or shape of the opening selected from among the openings of the second insulating layer 160 and the third insulating layer 180 that overlap the opening of the buffer layer 120 may be different.

For example, the size (e.g., breadth, diameter, or planar area) of the opening 68b of the second insulating layer 160 and the third insulating layer 180 overlapping the opening 68a of the buffer layer 120 may be smaller than the size (e.g., breadth, diameter, or planar area) of the opening 68a, and in a plan view, the opening 68b may be disposed inside the opening 68a. For example, in a plan view, the opening 68a may overlap the entire opening 68b. The opening 68b and the opening 68a may be formed to the upper surface of the conductive pattern 111, respectively.

The size (e.g., breadth, diameter, or planar area) of the opening 60d of the second insulating layer 160 and the third insulating layer 180 overlapping the opening 60c of the buffer layer 120 may be smaller than the size (e.g., breadth, diameter, or planar area) of the opening 60c, and in a plan view, the opening 60d may be disposed inside the opening 60c. For example, in a plan view, the opening 60c may overlap the entire opening 60d. The opening 60d and the opening 60c may be formed to the upper surface of the driving voltage line 172, respectively.

The size (e.g., breadth, diameter, or planar area) of the opening 64d of the second insulating layer 160 and the third insulating layer 180 overlapping the opening 64c of the buffer layer 120 may be smaller than the size (e.g., breadth, diameter, or planar area) of the opening 64c, and in a plan view, the opening 64d may be disposed inside the opening 64c. For example, in a plan view, the opening 64c may overlap the entire opening 64d. The opening 64d and the opening 64c may be formed to the upper surfaces of the data lines 171a, 171b, 171c, respectively.

In addition, the sizes (e.g., breadths, diameters, or planar areas) of the openings (e.g., one or more of the other openings) of the second insulating layer 160 and the third insulating layer 180 overlapping the openings (e.g., corresponding openings) of the buffer layer 120 may be smaller than the size (e.g., breadth, diameter, or planar area) of the opening of the buffer layer 120, and in a plan view, the opening of the second insulating layer 160 and the third insulating layer 180 may be disposed inside the opening of the buffer layer 120. For example, in a plan view, the opening of the buffer layer 120 may overlap the entire opening of the second insulating layer 160 and the third insulating layer 180.

The manufacturing method of the display device according to an embodiment of the present disclosure will now described with reference to FIG. 19 and FIG. 20 along with FIG. 17 and FIG. 18.

Figure 19:
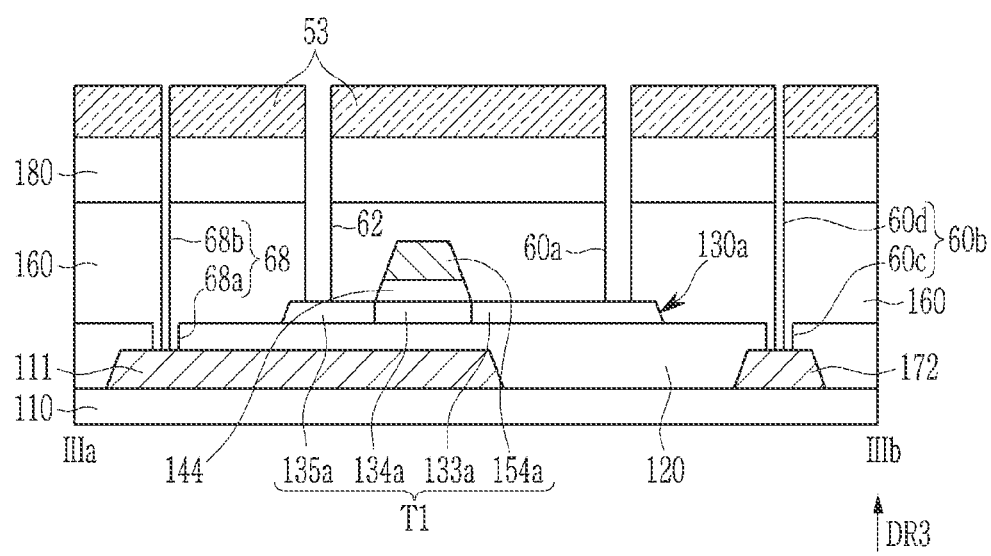
FIG. 19 and FIG. 20 are other example embodiments of cross-sectional views of a display device in a process after a manufacturing process of a display device respectively shown in FIG. 11 and FIG. 12 and are, respectively, cross-sectional views taken along lines corresponding to lines IIIa-IIIb and IVa-IVb shown in FIG. 2.
Figure 20:
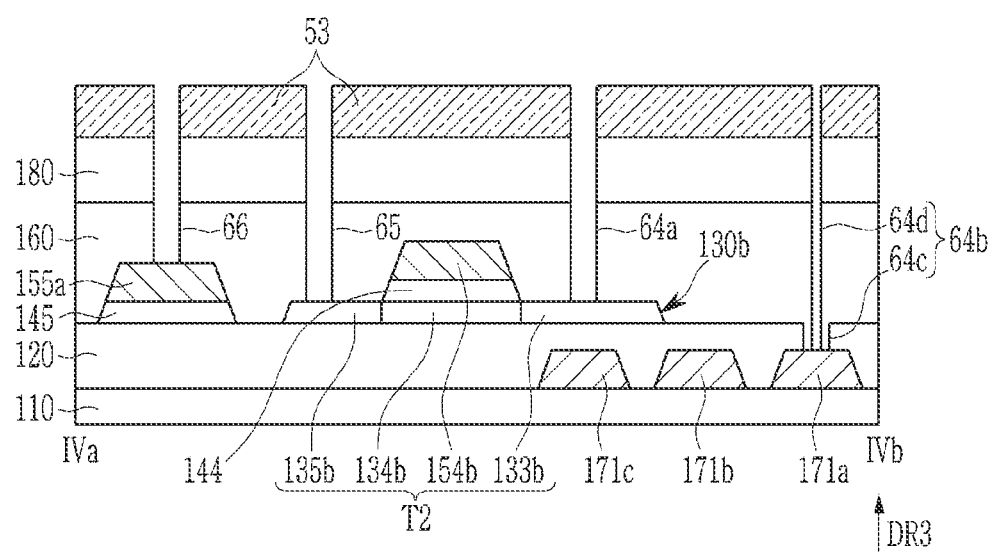

FIG. 19 and FIG. 20 are other example embodiments of cross-sectional views of a display device in a process after (e.g., next to) a manufacturing process of a display device respectively shown in FIG. 11 and FIG. 12 and are, respectively, cross-sectional views taken along lines corresponding to lines IIIa-IIIb and IVa-IVb shown in FIG. 2.

The manufacturing method of the display device according to the embodiment of the present disclosure is mostly the same as the manufacturing method according to the process illustrated in FIG. 5 to FIG. 16. However, as shown in FIG. 19 and FIG. 20, instead of as shown in FIG. 13 and FIG. 14, the mask pattern 53 may have a different shape. Accordingly, the size (e.g., breadth, diameter, or planar area) of each of the openings of the second insulating layer 160 and the third insulating layer 180 formed at the place overlapping the opening (e.g., corresponding opening) of the buffer layer 120 may be smaller than the size (e.g., breadth, diameter, or planar area) of the opening of the buffer layer 120, and in a plan view, the openings of the second insulating layer 160 and the third insulating layer 180 may be disposed inside the opening of the buffer layer 120. For example, in a plan view, the opening of the buffer layer 120 may overlap the entire or combined opening of the opening of the second insulating layer 160 and the opening of the third insulating layer 180.

Next, the display device according to an embodiment of the present disclosure is described with reference to FIG. 21 and FIG. 22 along with FIG. 2 to FIG. 4 described above.

Figure 21:
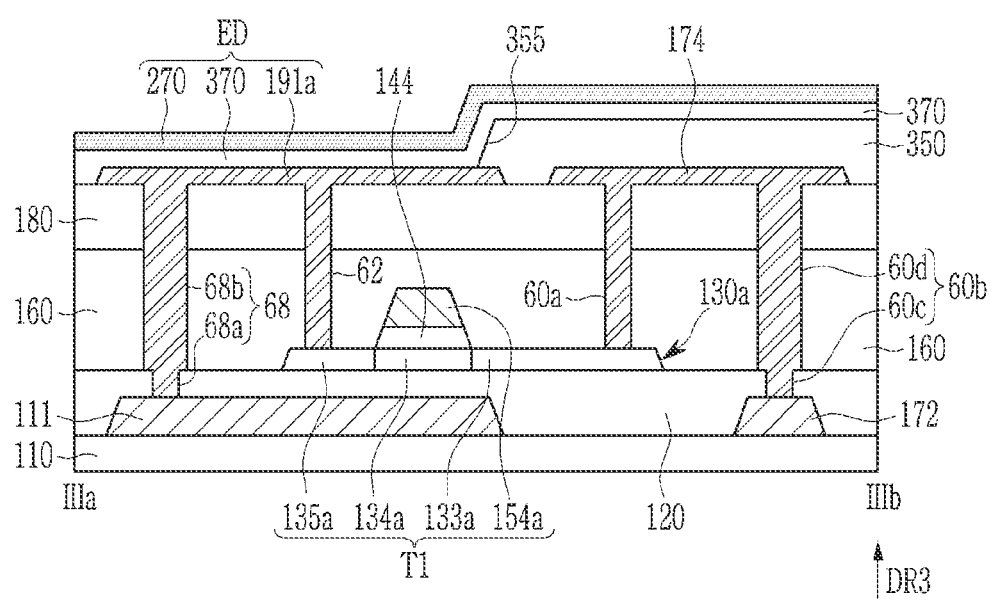
FIG. 21 is a cross-sectional view of a display device shown in FIG. 2 taken along a line IIIa-IIIb as another example embodiment.
Figure 22:
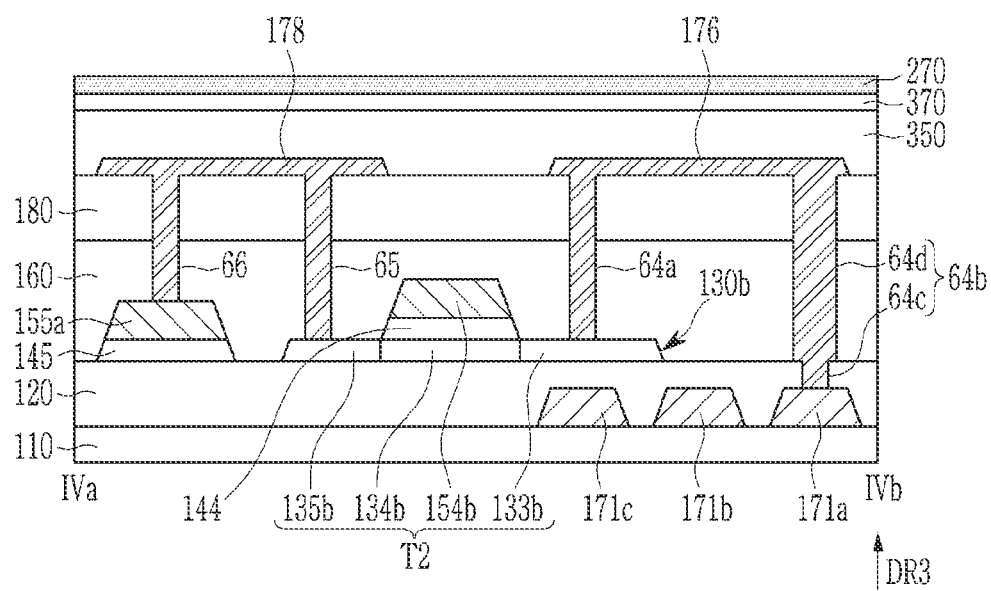
FIG. 22 is a cross-sectional view of a display device shown in FIG. 2 taken along a line IVa-IVb as another example embodiment.

FIG. 21 is a cross-sectional view of a display device shown in FIG. 2 taken along a line IIIa-IIIb as another example embodiment, and FIG. 22 is a cross-sectional view of a display device shown in FIG. 2 taken along a line IVa-IVb as another example embodiment.

Referring to FIG. 21 and FIG. 22, the display device according to the present embodiment is the same as most of the display device according to the embodiment shown in FIG. 2 to FIG. 4 described above. However, the size and/or shape of the opening selected from among openings of the second insulating layer 160 and the third insulating layer 180 that overlap the opening of the buffer layer 120 may be different.

For example, the size (e.g., breadth, diameter, or planar area) of the opening 68b of the second insulating layer 160 and the third insulating layer 180 overlapping the opening 68a of the buffer layer 120 may be larger than the size (e.g., breadth, diameter, or planar area) of the opening 68a, and in a plan view, the opening 68a may be disposed inside the opening 68b. For example, in a plan view, the opening 68b may overlap the entire opening 68a. The edge (e.g., side surface) of the opening 68b may be formed to the top surface of the buffer layer 120. The side of the opening 68b and the top surface of the buffer layer 120 and the side of the opening 68a of the buffer layer 120 may together form a stepped shape. The opening 68a and the opening 68b are connected to each other to form one opening 68, and the opening 68 may be filled with the extension of each of the pixel electrodes 191a, 191b and 191c, for example, the same material as the pixel electrodes 191a, 191b and 191c.

The size (e.g., breadth, diameter, or planar area) of the opening 60d of the second insulating layer 160 and the third insulating layer 180 overlapping the opening of the buffer layer 120 may be smaller than the size (e.g., breadth, diameter, or planar area) of the opening 60c, and the opening 60c may be disposed inside the opening 60d in a plan view. For example, in a plan view, the opening 60d may overlap the entire opening 60c. The edge (e.g., side surface) of the opening 60d may be formed to the top surface of the buffer layer 120. The side (e.g., side surface) of the opening 60d, the top surface of the buffer layer 120, and the side (e.g., side surface) of the opening 60c of the buffer layer 120 may together form a stepped shape. The opening 60c and the opening 60d are connected to each other to form one opening 60b, and the opening 60b may be filled with the extension of the connecting member 174, for example, the same material as the connecting member 174.

The size (e.g., breadth, diameter, or planar area) of the opening 64d of the second insulating layer 160 and the third insulating layer 180 overlapping the opening 64c of the buffer layer 120 may be larger than the size (e.g., breadth, diameter, or planar area) of the opening 64c, and in a plan view, the opening 64c may be disposed inside the opening 64d. For example, in a plan view, the opening 64d may overlap the entire opening 64c. The edge (e.g., side surface) of the opening 64d may be formed to the top surface of the buffer layer 120. The side (e.g., side surface) of the opening 64d, the top surface of the buffer layer 120, and the side (e.g., side surface) of the opening 64c of the buffer layer 120 may together form a stepped shape. The opening 64c and the opening 64d may be connected to each other to form one opening 64b, and the opening 64b may be filled with the extension of the connecting member 176, for example, the same material as the connecting member 176.

In addition, the size (e.g., breadth, diameter, or planar area) of the openings (e.g., one or more of the other openings) of the second insulating layer 160 and the third insulating layer 180 overlapping the openings (e.g., corresponding openings) of the buffer layer 120 may be larger than the size (e.g., breadth, diameter, or planar area) of the openings of the buffer layer 120, and in a plan view, the opening of the buffer layer 120 may be disposed inside the opening of the second insulating layer 160 and the third insulating layer 180. For example, in a plan view, the opening (or combined opening) of the second insulating layer 160 and the third insulating layer 180 may overlap the entire opening of the buffer layer 120. In some embodiments, the side (or combined side) of the opening of the second insulating layer 160 and the third insulating layer 180, the top surface of the buffer layer 120, and the side of the opening of the buffer layer 120 may together form a stepped shape. The openings of the buffer layer 120 and the openings of the second insulating layer 160 and the third insulating layer 180 may be connected to each other to form one opening, and the one opening may be filled with one material (e.g., material of the third conductive layer).

A manufacturing method of the display device according to an embodiment of the present disclosure will now described with reference to FIG. 23 and FIG. 24 along with FIG. 21 and FIG. 22.

Figure 23:
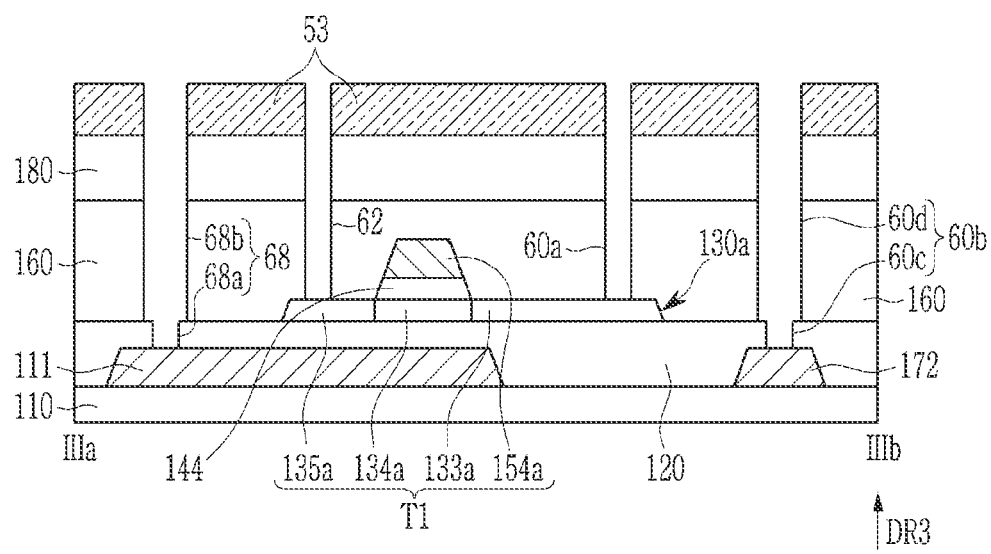
FIG. 23 and FIG. 24 are other example embodiments of cross-sectional views of a display device in a process after a manufacturing process of a display device respectively shown in FIG. 11 and FIG. 12 and are, respectively, cross-sectional views taken along lines corresponding to lines IIIa-IIIb and IVa-IVb shown in FIG. 2.
Figure 24:
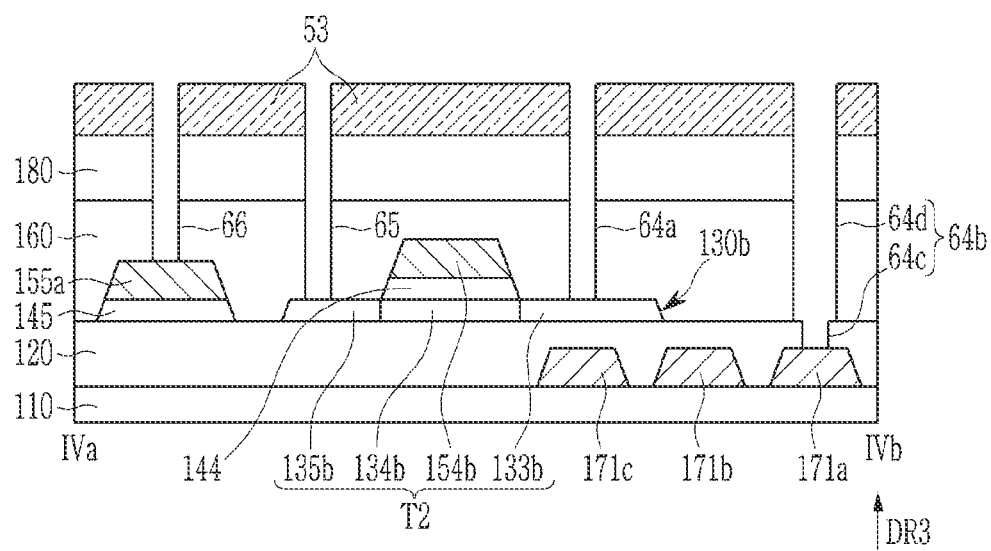

FIG. 23 and FIG. 24 are other example embodiments of cross-sectional views of a display device in a process after (e.g., next to) a manufacturing process of a display device respectively shown in FIG. 11 and FIG. 12 and are, respectively, cross-sectional views taken along lines corresponding to lines IIIa-IIIb and IVa-IVb shown in FIG. 2.

The manufacturing method of the display device according to an embodiment of the present disclosure is mostly the same as the manufacturing method according to the process shown in FIG. 5 to FIG. 16 described above. However, the shape of the mask pattern 53 may be different, as shown in FIG. 23 and FIG. 24 and as compared to FIG. 13 and FIG. 14. Accordingly, the size (e.g., breadth, diameter, or planar area) of the openings of the second insulating layer 160 and the third insulating layer 180, which are formed at the place overlapping the openings of the buffer layer 120, may be larger than the size (e.g., breadth, diameter, or planar area) of the openings of the buffer layer 120, and in a plan view, the openings of the second insulating layer 160 and the third insulating layer 180 may have the edge (e.g., side surface) surrounding the opening of the buffer layer 120. For example, in a plan view, the opening of the second insulating layer 160 and the third insulating layer 180 may overlap the entire opening of the buffer layer 120.

Next, the display device according to an embodiment of the present disclosure is described with reference to FIG. 25 to FIG. 27 along with FIG. 2 to FIG. 4 described above.

Figure 25:
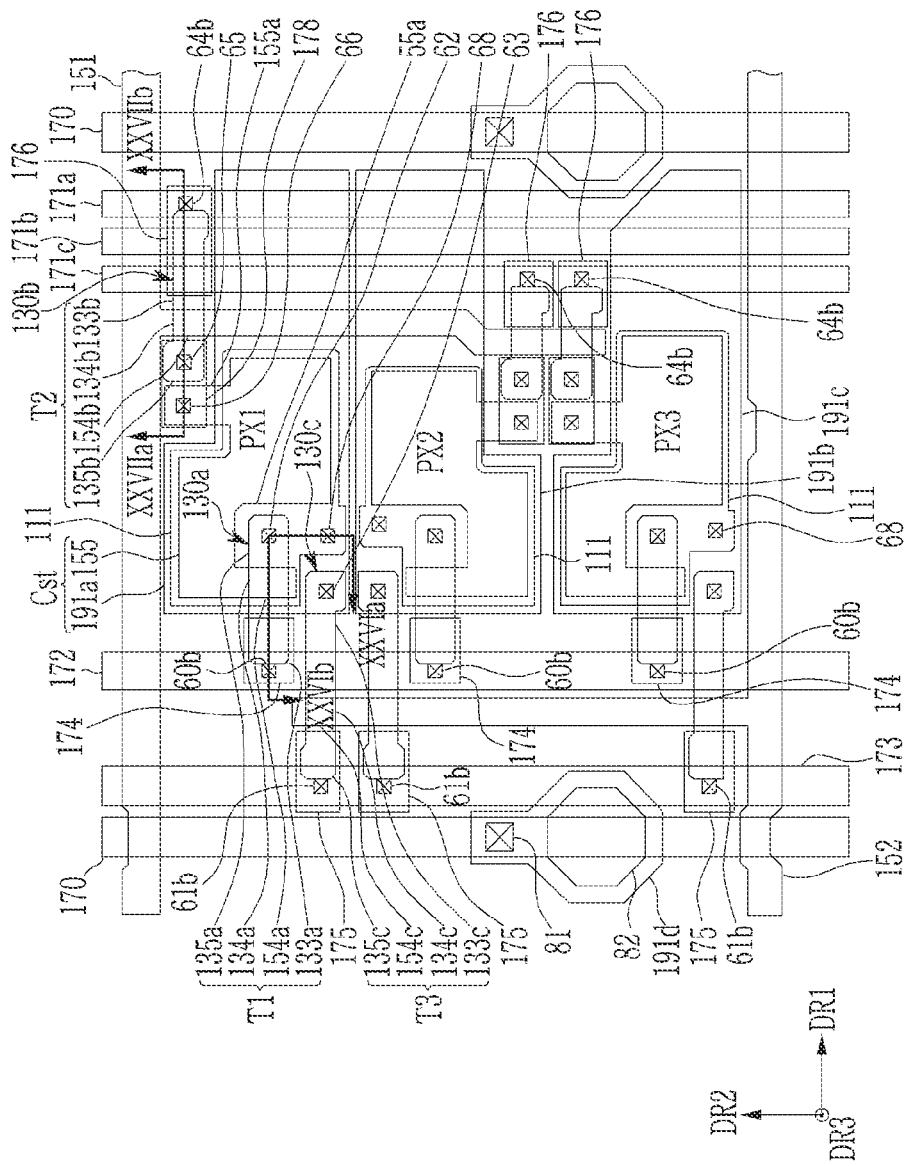
FIG. 25 is a layout view of a plurality of pixels of a display device according to an embodiment of the present disclosure.
Figure 26:
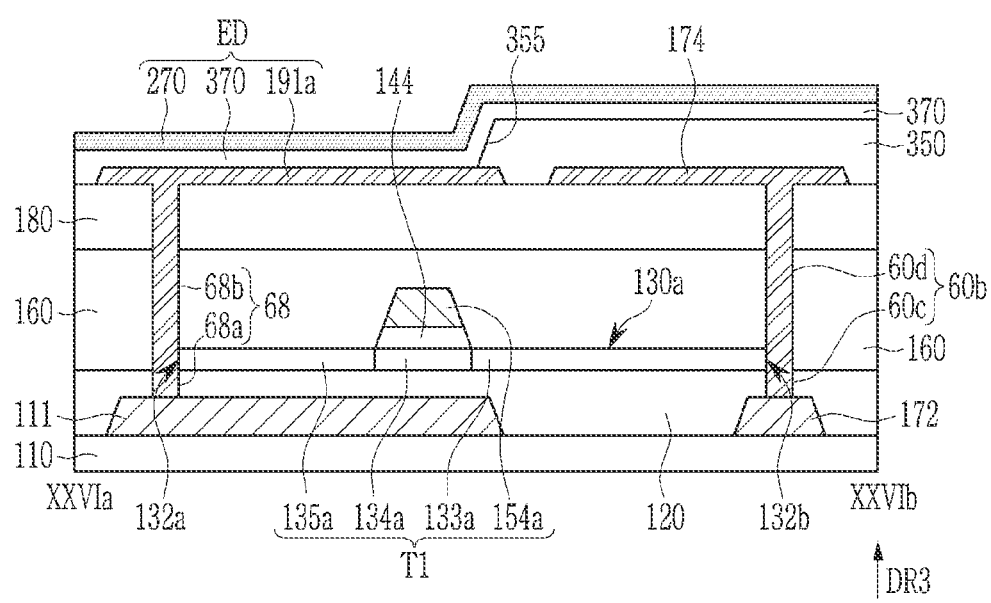
FIG. 26 is a cross-sectional view of a display device shown in FIG. 25 taken along a line XXVIa-XXVIb.
Figure 27:
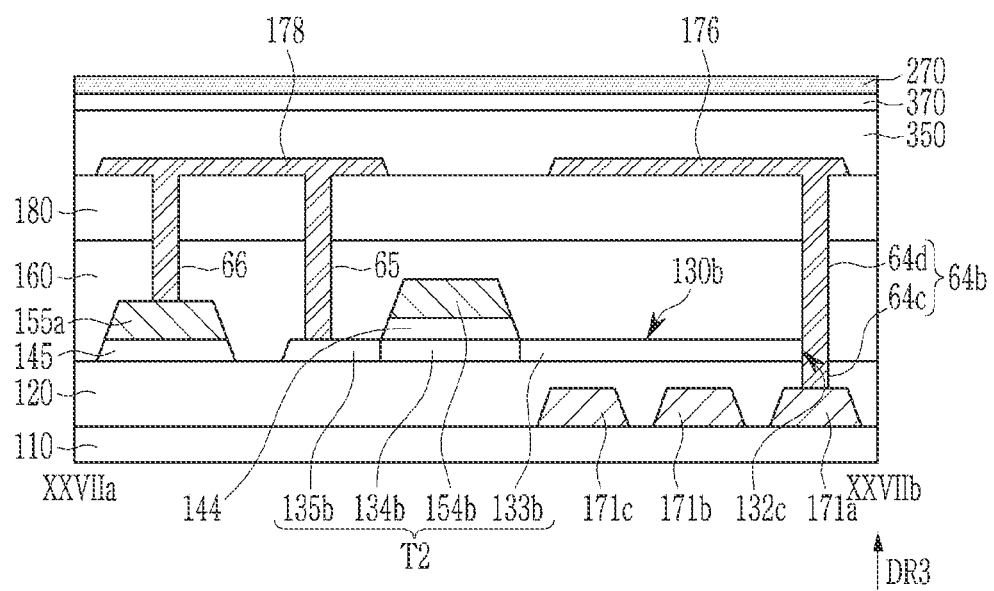
FIG. 27 is a cross-sectional view of a display device shown in FIG. 25 taken along a line XXVIIa-XXVIIb.

FIG. 25 is a layout view of a plurality of pixels of a display device according to an embodiment of the present disclosure, FIG. 26 is a cross-sectional view of a display device shown in FIG. 25 taken along a line XXVIa-XXVIb, and FIG. 27 is a cross-sectional view of a display device shown in FIG. 25 taken along a line XXVIIa-XXVIIb.

Referring to FIG. 25 to FIG. 27, the display device according to the present embodiment is the same as most of the display device according to the embodiment shown in FIG. 2 to FIG. 4 described above. However, the number of the openings in (e.g., associated with) each pixel (PX1, PX2, PX3) may be smaller.

In more detail, in the display device according to the present embodiment, the openings 60a, 62, 61a, and 64a included in the display device according to the embodiments illustrated in FIG. 2 to FIG. 4 may be omitted.

Each of the pixel electrodes 191a, 191b and 191c may be electrically connected to the conductive pattern 111 and the drain region 135a of the first transistor T1 through one opening 68. For example, the pixel electrodes 191a, 191b, and 191c may be in contact with the top surface of the conductive pattern 111 and a side surface 132a of the drain region 135a side of the active pattern 130a through the opening 68 to be electrically connected to the conductive pattern 111 and the drain region 135a.

In some embodiments, the second insulating layer 160 is not disposed between the extension of the pixel electrode 191a disposed in the opening 68 and the side surface 132a of the drain region 135a side of the active pattern 130a.

In a plan view, the side surface 132a of the drain region 135a side of the active pattern 130a or the edge thereof may be aligned with the side surface of the opening 68a of the buffer layer 120 or the edge thereof.

The connecting member 174 may be electrically connected to the driving voltage line 172 and the source region 133a of the first transistor T1 through one opening 60b. For example, the connecting member 174 may be in contact with the top surface of the driving voltage line 172 and a side surface 132b of the source region 133a side of the active pattern 130a through the opening 60b to be electrically connected to the driving voltage line 172 and the source region 133a.

In some embodiments, the second insulating layer 160 is not disposed between the extension of the connecting member 174 disposed in the opening 60b and the side surface 132b of the source region 133a side of the active pattern 130a.

In a plan view, the side surface 132b of the source region 133a side of the active pattern 130a or the edge thereof may be aligned with the side surface of the opening 60*c* of the buffer layer 120 or the edge thereof.

The connecting member 175 may be electrically connected to the initialization voltage line 173 and the drain region 135*c* of the third transistor T3 through one opening 61*b*. For example, the connecting member 175 may be in contact with the top surface of the initialization voltage line 173 and the side surface of the drain region 135*c* side of the active pattern 130*c* through the opening 61*b* to be electrically connected to the initialization voltage line 173 and the drain region 135*c*.

In some embodiments, the second insulating layer 160 is not disposed between the extension of the connecting member 175 disposed in the opening 61*b* and the side surface of the drain region 135*c* side of the active pattern 130*c*.

In a plan view, the side surface of the drain region 135*c* of the active pattern 130*c* or the edge thereof may be aligned with the side surface of the opening 61*b* (e.g., the portion of the opening 61*b* that is in the buffer layer 120) or the edge thereof.

The connecting member 176 may be electrically connected to the data lines 171*a*, 171*b*, 171*c* and the source region 133*b* of the second transistor T2 through one opening 64*b*. For example, the connecting member 176 may be in contact with the top surface of the data lines 171*a*, 171*b*, 171*c* and a side surface 132*c* of the source region 133*b* side of the active pattern 130*b* through the opening 64*b* to be electrically connected to the data lines 171*a*, 171*b*, 171*c* and the source region 133*b*.

The second insulating layer 160 may not be disposed between the extension of the connecting member 176 disposed in the opening 64*b* and the side surface 132*c* of the source region 133*b* side of the active pattern 130*b*.

In a plan view, the side surface 132*c* of the source region 133*b* side of the active pattern 130*b* or the edge thereof may be aligned with the side surface of the opening 64*c* or the edge thereof.

As described above, according to the present embodiment, the number of the openings for the contact between the different layers stacked on the substrate 110 of the display device for each of the pixels PX1, PX2, PX3 may be reduced, so that the area of one pixel (PX1, PX2, PX3) may be reduced and a display device having high resolution may be provided.

The manufacturing method of the display device according to an embodiment of the present disclosure will now described with reference to FIG. 28 to FIG. 31 along with FIG. 25 to FIG. 27.

Figure 28:
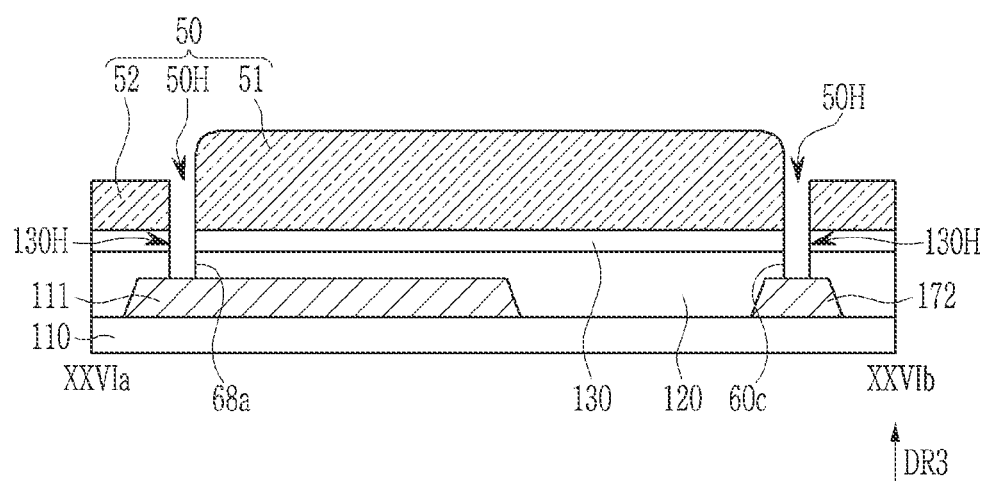
FIG. 28 and FIG. 29 are other example embodiments of cross-sectional views of a display device in a process after a manufacturing process of a display device respectively shown in FIG. 5 and FIG. 6 and are, respectively, cross-sectional views taken along lines corresponding to lines XXVIa-XXVIb and XXVIIa-XXVIIb shown in FIG. 25, FIG. 30 and FIG. 31 are other example embodiments of cross-sectional views of a display device in a process after a manufacturing process of a display device respectively shown in FIG. 28 and FIG. 29 and are, respectively, cross-sectional views taken along lines corresponding to lines XXVIa-XXVIb and XXVIIa-XXVIIb shown in FIG. 25.
Figure 29:
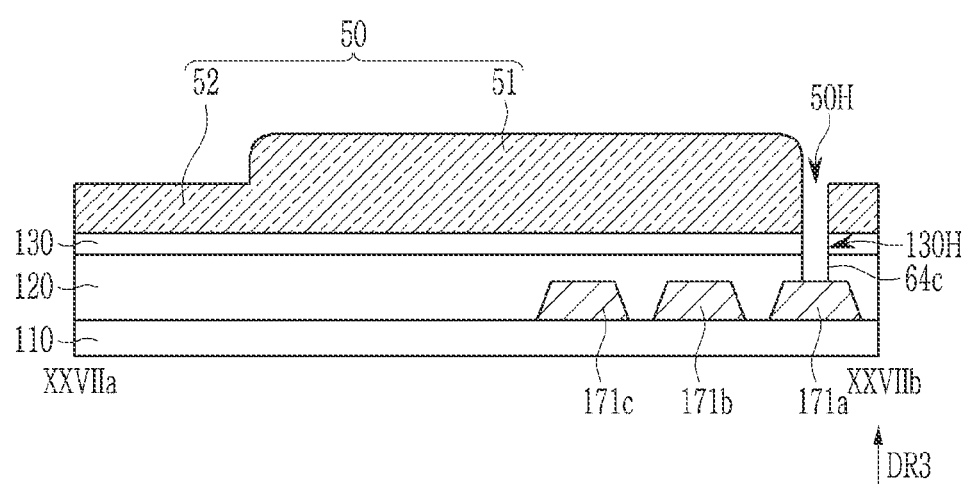
Figure 30:
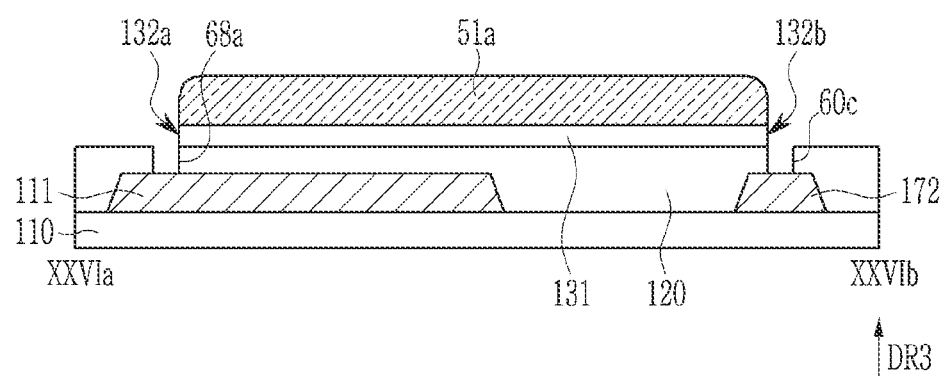
Figure 31:
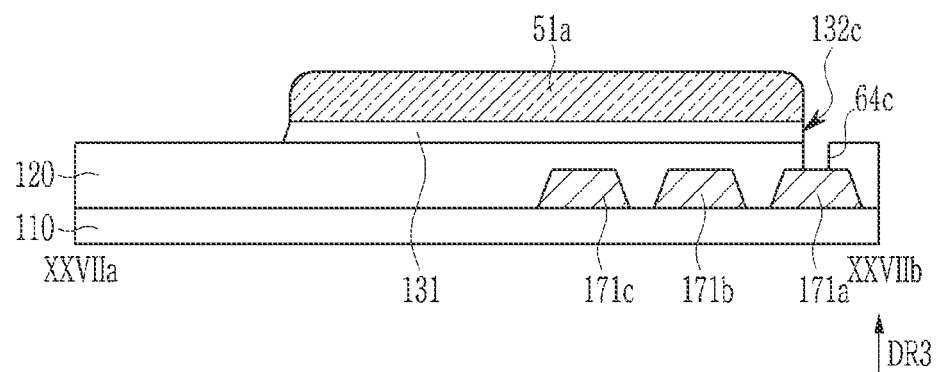

FIG. 28 and FIG. 29 are other example embodiments of cross-sectional views of a display device in a process after (e.g., next to) a manufacturing process of a display device respectively shown in FIG. 5 and FIG. 6 and are, respectively, cross-sectional views taken along lines corresponding to lines XXVIa-XXVIb and XXVIIa-XXVIIb shown in FIG. 25. FIG. 30 and FIG. 31 are other example embodiments of cross-sectional views of a display device in a process after (e.g., next to) a manufacturing process of a display device respectively shown in FIG. 28 and FIG. 29 and are, respectively, cross-sectional views taken along lines corresponding to lines XXVIa-XXVIb and XXVIIa-XXVIIb shown in FIG. 25.

The manufacturing method of the display device according to an embodiment of the present disclosure is the same as most of the manufacturing method according to the process shown in FIG. 5 to FIG. 16 and described above.

However, the shape of the mask patterns 50 and 51*a* may be different as shown in FIG. 28 to FIG. 31 and as compared to FIG. 7 to FIG. 10.

First, referring to FIG. 28 and FIG. 29, an edge (e.g., side surface) of the thick first portion 51 of the mask pattern 50 according to the present embodiment may be adjacent to and aligned with the edge (e.g., side surface) of the openings 60*c*, 64*c*, and 68*a* of the buffer layer 120. Accordingly, the edge (e.g., side surface) of the thick first portion 51 of the mask pattern 50 may form the side surface of the opening 50H. The semiconductor layer 130 and the buffer layer 120 are etched by utilizing the mask pattern 50 as a mask to form the openings 60*c*, 64*c*, and 68*a* of the buffer layer 120 and the opening 130H of the semiconductor layer 130, which correspond to the opening 50H.

Next, referring to FIG. 30 and FIG. 31, the mask pattern 50 as respectively shown in FIGS. 28 and 29 is etched back or ashed to remove the second portion 52 and to form a mask pattern 51*a* including at least a portion or part of the first portion 51 and having a thickness less than that of the first portion 51. An edge (e.g., side surface) of the mask pattern 51*a* adjacent to the openings 60*c*, 64*c*, and 68*a* of the buffer layer 120 may be aligned with the edge (e.g., side surface) of the openings 60*c*, 64*c*, and 68*a* of the buffer layer 120.

The semiconductor layer 130 may be patterned by utilizing the mask pattern 51*a* to form a plurality of semiconductor patterns 131. The side surfaces 132*a*, 132*b*, and 132*c* of the edge (e.g., side surface) of the semiconductor pattern 131 may be aligned with the edges (e.g., side surfaces) of the openings 60*c*, 64*c*, and 68*a* of the buffer layer 120.

Next, an example of a cross-sectional structure of the display device according to an embodiment of the present disclosure is described with reference to FIG. 32 along with the drawings described above.

Figure 32:
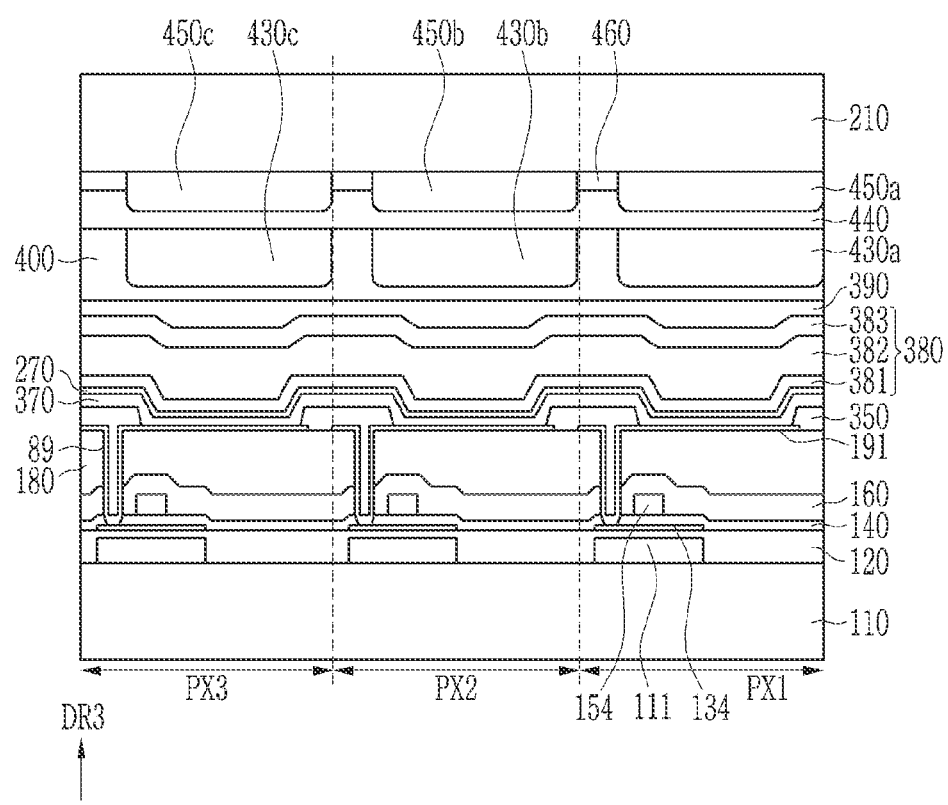
FIG. 32 is a cross-sectional view of a display device according to an embodiment of the present disclosure.

FIG. 32 is a cross-sectional view of a display device according to an embodiment of the present disclosure. The same descriptions of the above-described components may not be repeated.

Referring to FIG. 32, on the substrate 110 of the display device according to an embodiment of the present disclosure, the first conductive layer including the conductive pattern 111, the buffer layer 120, an active pattern 134, a first insulating layer 140, the second conductive layer including the gate electrode 154, the second insulating layer 160, the third insulating layer 180, the third conductive layer including a plurality of pixel electrodes 191, the fourth insulating layer 350, the emission layer 370, and the common electrode 270 may be sequentially disposed.

The first insulating layer 140 may be similar to (e.g., composed of the same or similar material as) the insulating pattern 144 (or 144 and 145) described above. However, unlike the insulating pattern 144 (or 144 and 145), the first insulating layer 140 may have a shape that is formed on (e.g., over) the entire surface of the substrate 110 and is partially removed (e.g., to provide through holes). In some embodiments, the same structure as the insulating pattern 144 (or 144 and 145) may be disposed instead of the first insulating layer 140.

The pixel electrode 191 may be electrically connected to the conductive region (e.g., a drain region) of the active pattern 134 through an opening 89 of the second insulating layer 160 and the third insulating layer 180. For example, the pixel electrode 191 may be electrically connected to the conductive region (e.g., drain region) of the active pattern 134 through the opening 89 and through an opening in the first insulating layer 140 overlapping the opening 89.

The emission layer 370 may include (e.g., be) a light emitting material that emits a first color light, which may be blue light.

An encapsulation layer 380 including a plurality of insulating layers 381, 382, and 383 may be disposed on the common electrode 270. The insulating layer 381 and the insulating layer 383 may include (e.g., be) an inorganic insulating material, and the insulating layer 382 disposed between the insulating layer 381 and the insulating layer 383 may include (e.g., be) an organic insulating material.

A filling layer 390 including a filler may be disposed on the encapsulation layer 380. A cover layer 400 including (e.g., being) an insulating material, and a plurality of color conversion layers 430a and 430b and a transmission layer 430c, may be disposed on the filling layer 390.

The transmission layer 430c may pass (e.g., transmit) incident light. For example, the transmission layer 430c may transmit the first color light, which may be the blue light. The transmission layer 430c may include (e.g., be) a polymer material that transmits the first color light. The region in which the transmission layer 430c is disposed may correspond to a light emitting region emitting the blue color, and the transmission layer 430c may pass the incident first color light as it is without separately including semiconductor nanocrystals. For example, the transmission layer 430c may not include semiconductor nanocrystals.

The color conversion layers 430a and 430b may include different semiconductor nanocrystals. For example, the first color light incident on the color conversion layer 430a may be converted into a second color light to be emitted by the semiconductor nanocrystals included in the color conversion layer 430a. The first color light incident on the color conversion layer 430b may be converted into a third color light to be emitted by the semiconductor nanocrystals included in the color conversion layer 430b.

The semiconductor nanocrystals may include (e.g., be) at least one selected from among a phosphor and a quantum dot material that converts the incident first color light into the second color light or the third color light.

A core of the quantum dot may be selected from a Group II-VI compound, a Group III-V compound, a Group IV-VI compound, a Group IV element, a Group IV compound, and a combination thereof.

The Group II-VI compound may be selected from the group consisting of a binary compound selected from among the group consisting of CdSe, CdTe, ZnS, ZnSe, ZnTe, ZnO, HgS, HgSe, HgTe, MgSe, MgS, and a mixture thereof; a ternary compound selected from among the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from among the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-V compound may be selected from among the group consisting of a binary compound selected from among the group consisting of GaN, GaP, GaAs, GaSb, AlN, AlP, AlAs, AlSb, InN, InP, InAs, InSb, and a mixture thereof; a ternary compound selected from among the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof; and a quaternary compound selected from among the group consisting of GaAlNAs, GaAlNSb, GaAlPAs, GaAlPSb, GaInNP, GaIn-NAs, GaInNSb, GaInPAs, GaInPSb, InAlNP, InAlNAs, InAlNSb, InAlPAs, InAlPSb, and a mixture thereof.

The Group IV-VI compound may be selected from among the group consisting of a binary compound selected from among the group consisting of SnS, SnSe, SnTe, PbS, PbSe, PbTe, and a mixture thereof; a ternary compound selected from among the group consisting of SnSeS, SnSeTe, SnSTe, PbSeS, PbSeTe, PbSTe, SnPbS, SnPbSe, SnPbTe, and a mixture thereof; and a quaternary compound selected from among the group consisting of SnPbSSe, SnPbSeTe, SnPb-STe, and a mixture thereof. The Group IV element may be selected from among the group consisting of Si, Ge, and a mixture thereof. The Group IV compound may be a binary compound selected from among the group consisting of SiC, SiGe, and a mixture thereof.

In this case, the binary compound, the ternary compound, or the quaternary compound may exist in particles at a uniform concentration, or may exist in the same particle divided into states where concentration distributions are partially different. Further, the color conversion layer may have a core/shell structure where one quantum dot surrounds another quantum dot. An interface between the core and the shell may have a concentration gradient, such that a concentration of an element existing in the shell is gradually reduced toward the center thereof.

In some embodiments, the quantum dot may have a core-shell structure including the core including the nanocrystal described above and a shell surrounding the core. The shell of the quantum dot serves as a protective layer to prevent or reduce chemical denaturation of the core and/or to serve as a charging layer to impart electrophoretic characteristics to the quantum dot. The shell may be a single layer or a multiple layer. The interface between the core and the shell may have a concentration gradient in which the concentration of the elements existing in the shell decreases toward the center. Examples of the shells of the quantum dot include metal or non-metal oxides, semiconductor compounds, or combinations thereof.

For example, the metal or nonmetal oxide may be a binary compound such as SiO2 ($SiO_2$), Al2O3 ($Al_2O_3$), TiO2 ($TiO_2$), ZnO, MnO, Mn2O3 ($Mn_2O_3$), Mn3O4 ($Mn_3O_4$), CuO, FeO, Fe2O3 ($Fe_2O_3$), Fe3O4 ($Fe_3O_4$), CoO, Co3O4 ($Co_3O_4$), and NiO, or a ternary compound such as MgAl2O4 ($MgAl_2O_4$), CoFe2O4 ($CoFe_2O_4$), NiFe2O4 ($NiFe_2O_4$), and CoMn2O4 ($CoMn_2O_4$), but the present disclosure is not limited thereto.

Also, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb, however the present disclosure is not limited thereto.

The quantum dot may have a full width at half maximum (FWHM) of the light-emitting wavelength spectrum that is equal to or less than about 45 nm, preferably equal to or less than about 40 nm, and more preferably equal to or less than about 30 nm. In this range, color purity or color reproducibility may be improved. In addition, because light emitted through the quantum dot is emitted in all directions, a viewing angle of light may be improved.

Further, the quantum dot is not limited to having shapes that are generally utilized in the technical field related to the present disclosure, and the quantum dot may have a shape such as a nano-particle having a spherical shape, a pyramid shape, a multi-arm shape, or a cubic shape, or may be a nanotube, a nanowire, a nanofiber, a planar nano-particle, etc.

The quantum dot may control a color of emitted light according to a particle size thereof, and thus the quantum dot may have various suitable light emitting colors such as blue, red, and green colors.

An insulating layer 440 may be disposed on the plurality of color conversion layers 430a and 430b and the transmission layer 430c, and a plurality of color filters 450a, 450b and 450c and a light blocking member 460 may be disposed (e.g., may be disposed on the insulating layer 440).

The color filter 450a may represent (e.g., correspond to) the second color light, the color filter 450b may represent (e.g., correspond to) the third color light, and the color filter 450c may represent (e.g., correspond to) the first color light.

The light blocking member 460 may be disposed between the neighboring color filters 450a, 450b, and 450c.

A substrate 210 may be disposed on the plurality of color filters 450a, 450b, and 450c and the light blocking member 460. For example, the plurality of color conversion layers 430a and 430b and the plurality of color filters 450a, 450b, and 450c may be disposed between the substrate 110 and the substrate 210.

According to another embodiment of the present disclosure, the light emission layer 370 may include quantum dots instead of the plurality of color conversion layers 430a and 430b and the transmission layer 430c. For example, the display device may include quantum dots in the light emission layer 370 instead of the plurality of color conversion layers 430a and 430b and the transmission layer 430c.

While the present disclosure has been described in connection with the disclosed embodiments, it is to be understood that the present disclosure is not limited to the disclosed embodiments. On the contrary, it is intended to cover various suitable modifications and equivalent arrangements included within the spirit and scope of the appended claims and equivalents thereof.

DESCRIPTION OF SYMBOLS 51a, 52a, 53: mask pattern
110, 210: substrate
111: conductive pattern
120: buffer layer
130: semiconductor layer
130a, 130b, 130c, 134: active pattern
55a, 60a, 60b, 60c, 60d, 61a, 61b, 62, 63, 64a, 64b, 64c, 64d, 65, 66, 68, 68a, 68b, 81, 82, 89, 130H, 355: opening
131: semiconductor pattern
132a, 132b, 132c: side surface
133a, 133b, 133c: source region
134a, 134b, 134c: channel region
135a, 135b, 135c: drain region
140, 160, 180, 350, 381, 382, 440: insulating layer
144, 145: insulating pattern
151, 152: scan line
154a, 154b, 154c: gate electrode
155: driving gate electrode
170: common voltage line
171a, 171b, 171c: data line
172: driving voltage line
173: initialization voltage line
174, 175, 176, 178, 191d: connecting member
191, 191a, 191b, 191c: pixel electrode
270: common electrode
370: emission layer
380: encapsulation layer

What is claimed is:

1. A manufacturing method of a display device, the method comprising:
    forming a first conductive layer on a substrate;
    forming a first insulating layer and a semiconductor layer on the first conductive layer;
    forming a first mask pattern including a first portion and a second portion having different thicknesses, and having a first opening, on the semiconductor layer;
    patterning the first insulating layer and the semiconductor layer by utilizing the first mask pattern as a mask to form a second opening of the first insulating layer;
    removing the second portion of the first mask pattern to form a second mask pattern including a part of the first portion and having a thickness less than the thickness of the first portion;
    patterning the semiconductor layer by utilizing the second mask pattern as a mask to form a semiconductor pattern;
    forming a second insulating layer and a second conductive layer on the semiconductor pattern;
    forming a third insulating layer on the second conductive layer; and
    forming a third mask pattern on the third insulating layer and patterning the third insulating layer by utilizing the third mask pattern as a mask to form a third opening overlapping the second opening.

2. The manufacturing method of claim 1, wherein:
    the first opening is different in breadth from the second opening, and
    in the forming of the third opening, a side surface of the first opening and a side surface of the second opening are formed to a top surface of the first conductive layer.

3. The manufacturing method of claim 1, further comprising:
    forming a third conductive layer on the third insulating layer,
    wherein the second opening is different in breadth from the third opening,
    in the forming of the third opening, the second opening and the third opening are connected to each other to form one opening, and
    the one opening is filled with a material of the third conductive layer.

4. The manufacturing method of claim 1, wherein
    in the forming of the semiconductor pattern by patterning the semiconductor layer, a side surface of the semiconductor pattern is aligned with a side surface of the second opening of the first insulating layer.

* * * * *